US010804796B2

(12) United States Patent
 Botti et al.

(10) Patent No.: US 10,804,796 B2
(45) Date of Patent: Oct. 13, 2020

(54) ELECTRONIC CONVERTER, RELATED AUDIO SYSTEM, INTEGRATED CIRCUIT AND METHOD OF OPERATING AN ELECTRONIC CONVERTER

(71) Applicant: STMicroelectronics S.r.l., Agrate Brianza (IT)

(72) Inventors: Edoardo Botti, Vigevano (IT);
 Arunkumar Salimath, Hubli (IN);
 Edoardo Bonizzoni, Pavia (IT);
 Franco Maloberti, Torre d'Isola (IT);
 Paolo Cacciagrano, Cairate (IT);
 Davide Luigi Brambilla, Segrate (IT)

(73) Assignee: STMICROELECTRONICS S.R.L., Agrate Bianza (MB) (IT)

( * ) Notice: Subject to any disclaimer, the term of this patent is extended or adjusted under 35 U.S.C. 154(b) by 0 days.

(21) Appl. No.: 16/269,195

(22) Filed: Feb. 6, 2019

(65) Prior Publication Data
 US 2019/0245435 A1 Aug. 8, 2019

(30) Foreign Application Priority Data
 Feb. 7, 2018 (IT) .................. 102018000002464

(51) Int. Cl.
 *H02M 3/07* (2006.01)
 *H03F 3/217* (2006.01)
 (Continued)

(52) U.S. Cl.
 CPC ............. *H02M 3/07* (2013.01); *B60R 16/033* (2013.01); *H02M 3/00* (2013.01); *H02M 3/158* (2013.01);
 (Continued)

(58) Field of Classification Search
 CPC .......... H02M 3/07; H02M 3/00; H02M 3/158; H02M 2001/008; H03F 3/2173;
 (Continued)

(56) References Cited

U.S. PATENT DOCUMENTS 6,636,431 B2 * 10/2003 Seki ...................... H02M 1/083
 323/259
7,199,563 B2 * 4/2007 Ikezawa .............. H02M 3/1582
 323/222

(Continued)

FOREIGN PATENT DOCUMENTS

CN  101136590 A  3/2008
CN  101662262 A  3/2010
 (Continued)

OTHER PUBLICATIONS

Chen, et al., "Embedded Single-Inductor Bipolar-Output DC-DC Converter in Class-D Amplifier for Low Common Noise", IEEE Transactions on Power Electronics, vol. 31, No. 4, Apr. 2016, pp. 3106-3117.

(Continued)

*Primary Examiner* — Oyesola C Ojo
(74) *Attorney, Agent, or Firm* — Slater Matsil, LLP

(57) ABSTRACT

A converter includes a first switch coupled between a first input terminal and a first terminal of an inductor, and a second switch coupled between a second terminal of the inductor and a second input terminal. A third switch is coupled between the second terminal of the inductor and a first output terminal, and a fourth switch is coupled between the first terminal of the inductor and a second output terminal. A capacitor is coupled between the first and second output terminals. A control circuit monitors a regulated voltage between the first and second output terminals. During a charge phase, the first and second switches are closed to charge the inductor. During a discharge phase, the third
(Continued)

and fourth switches are closed to charge the capacitor and increase the regulated voltage.

25 Claims, 11 Drawing Sheets

(51) Int. Cl.
| | | |
|---|---|---|
| B60R 16/033 | (2006.01) | |
| H04R 3/00 | (2006.01) | |
| H02M 3/00 | (2006.01) | |
| H02M 3/158 | (2006.01) | |
| H03F 1/02 | (2006.01) | |
| H03F 3/187 | (2006.01) | |
| H02M 1/00 | (2006.01) | |

(52) U.S. Cl.
CPC ........... *H03F 1/0211* (2013.01); *H03F 3/187* (2013.01); *H03F 3/2171* (2013.01); *H03F 3/2173* (2013.01); *H04R 3/00* (2013.01); *H02M 2001/008* (2013.01); *H03F 2200/03* (2013.01)

(58) Field of Classification Search
CPC ...... H03F 1/0211; H03F 3/187; H03F 3/2171; H03F 2200/03; B60R 16/033; H04R 3/00
See application file for complete search history.

(56) References Cited

U.S. PATENT DOCUMENTS

| | | | |
|---|---|---|---|
| 7,262,658 B2 | 8/2007 | Ramaswamy et al. | |
| 7,990,215 B2 | 8/2011 | Soenen et al. | |
| 8,093,951 B1 | 1/2012 | Zhang et al. | |
| 8,237,417 B2* | 8/2012 | Miyamae | H02M 3/1582 323/259 |
| 8,274,330 B2 | 9/2012 | Paul et al. | |
| 8,493,050 B2* | 7/2013 | Miyamae | H02M 3/156 323/284 |
| 8,558,618 B2* | 10/2013 | Nussbaum | H03F 3/2178 330/251 |
| 10,186,945 B1* | 1/2019 | Lidsky | H02M 1/08 |
| 2007/0024256 A1 | 2/2007 | Chou | |
| 2008/0310046 A1 | 12/2008 | Menegoli et al. | |
| 2009/0135897 A1* | 5/2009 | Soma | H03F 3/217 375/238 |
| 2009/0167259 A1* | 7/2009 | Miyamae | H02M 3/1582 323/225 |
| 2009/0309658 A1 | 12/2009 | Mendenhall | |
| 2010/0134084 A1* | 6/2010 | Miyamae | H02M 3/157 323/283 |
| 2010/0225391 A1 | 9/2010 | Kim | |
| 2011/0127981 A1* | 6/2011 | Miyamae | H02M 3/156 323/282 |
| 2011/0175588 A1* | 7/2011 | Miyamae | H02M 3/1582 323/283 |
| 2011/0273156 A1* | 11/2011 | Miyamae | H02M 3/156 323/288 |
| 2012/0081085 A1* | 4/2012 | Miyamae | H02M 3/156 323/271 |
| 2014/0056041 A1* | 2/2014 | Zhu | H02M 3/1584 363/56.01 |
| 2015/0145439 A1* | 5/2015 | Szolusha | H05B 45/37 315/307 |
| 2015/0381044 A1 | 12/2015 | Bodano et al. | |
| 2016/0261185 A1* | 9/2016 | Lidsky | G05F 1/10 |
| 2016/0329868 A1 | 11/2016 | Liu et al. | |
| 2017/0093348 A1 | 3/2017 | Du et al. | |
| 2017/0110971 A1 | 4/2017 | Degen et al. | |
| 2017/0149403 A1 | 5/2017 | Cho et al. | |
| 2017/0331374 A1 | 11/2017 | Hoyerby | |
| 2019/0207505 A1* | 7/2019 | Ramadass | H02M 3/158 |
| 2019/0245498 A1 | 8/2019 | Botti et al. | |

FOREIGN PATENT DOCUMENTS

| | | | | |
|---|---|---|---|---|
| CN | 101826846 A | 9/2010 | | |
| CN | 102124647 A | 7/2011 | | |
| CN | 102142772 A | 8/2011 | | |
| CN | 104410276 A | 3/2015 | | |
| CN | 105075090 A | 11/2015 | | |
| CN | 105553241 A | 5/2016 | | |
| CN | 106169867 A | 11/2016 | | |
| CN | 106208991 A | 12/2016 | | |
| CN | 106602879 A | 4/2017 | | |
| CN | 107112892 A | 8/2017 | | |
| CN | 209562409 U | 10/2019 | | |
| CN | 209593735 U | 11/2019 | | |
| EP | 1895648 A2 | 3/2008 | | |
| JP | 2014093863 | * | 5/2014 | ........... H02M 3/155 |
| JP | 2014093863 A | | 5/2014 | |
| JP | 2014166092 | * | 9/2014 | ........... H02M 3/155 |
| JP | 2014166092 A | | 9/2014 | |

OTHER PUBLICATIONS

Belloni, M. et al., "A high efficiency 4-output single inductor DC-DC buck converter with self boosted snubber", Analog Integr Circ Sig Process (2011) 67:109-177: DOI 10.1007/s10470-010-9570-9, Received: Sep. 13, 2010/ Revised: Nov. 22, 2010/ Accepted: Nov. 26, 2010/ Published online: Dec. 12, 2010, Springer Science +Business Media, LLC 2010, pp. 16-177.

Maxim Integrated, Application Note 3977, "Class D Amplifiers: Fundamentals of Operation and Recent Developments", Jan. 31, 2007, 12 pages.

Huang, M.-H. et al.,, "Single-Inductor Multi-Output (SIMO) DC-DC Converters With High Light-Load Efficiency and Minimized Cross-Regulation for Portable Devices", IEEE Journal of Solid-State Circuits, vol. 44, No. 4, Apr. 2009, pp. 1099-1111.

\* cited by examiner

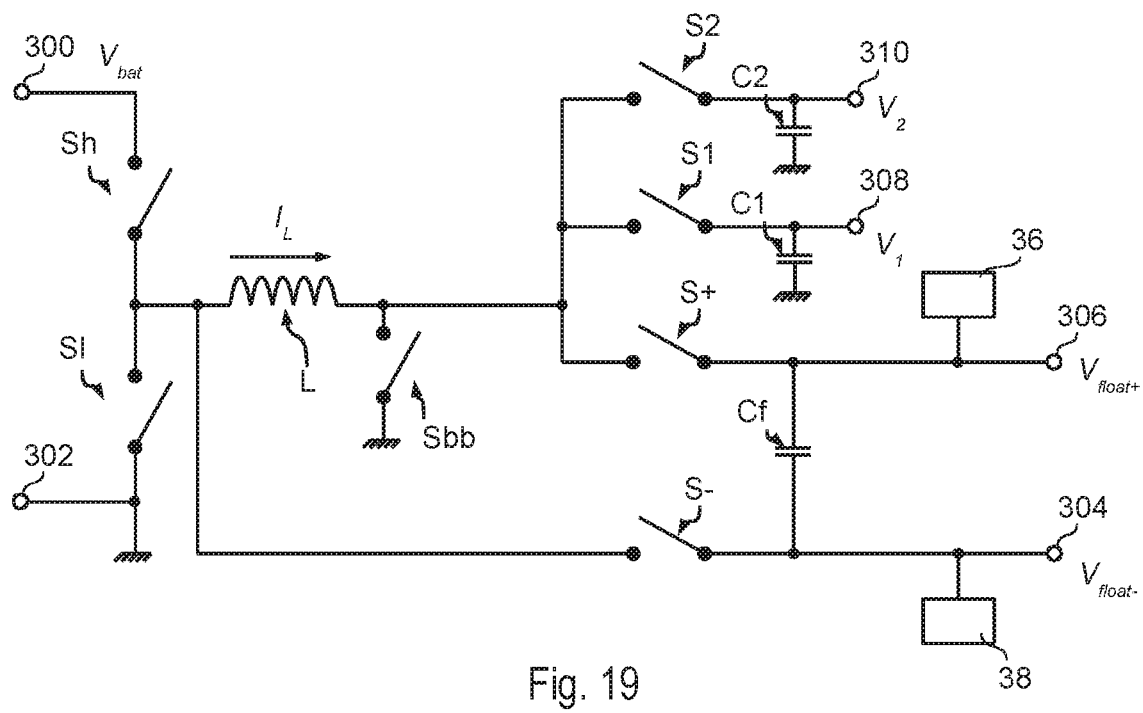
Fig. 19
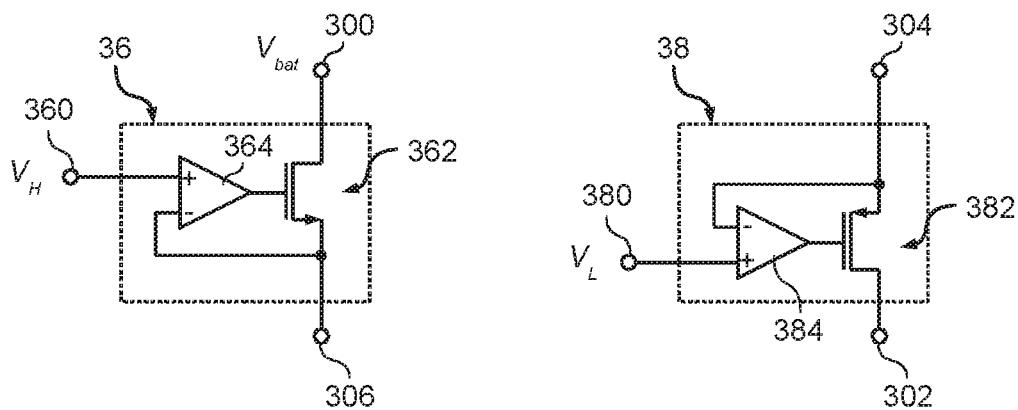
Fig. 20                                    Fig. 21

ELECTRONIC CONVERTER, RELATED AUDIO SYSTEM, INTEGRATED CIRCUIT AND METHOD OF OPERATING AN ELECTRONIC CONVERTER

CROSS-REFERENCE TO RELATED APPLICATIONS

This application claims priority to Italian Patent Application No. 102018000002464, filed on Feb. 7, 2018, which application is hereby incorporated herein by reference.

TECHNICAL FIELD

The present invention relates generally to an electronic system and method, and, in particular embodiments, to an electronic converter, related audio system, integrated circuit and method of operating an electronic converter.

BACKGROUND

FIG. 1 shows a typical audio system. In the example considered, the system comprises an audio signal generator 10, such as a radio, CD 0 MP3 player, generating an analog audio signal AS to be sent to at least one speaker SPK.

In the example considered, an audio amplifier 20 is connected between the audio signal generator 10 and the speaker SPK, which is configured to generate an amplified audio signal AAS by amplifying the analog audio signal AS provided by the audio signal generator 10.

For example, FIG. 2 shows a possible implementation of a so-called class-D audio amplifier 20. Specifically, in the example considered, the audio amplifier 20 comprises a waveform generator 202 generating a periodic triangular waveform signal TS, having typically a frequency between 250 kHz and 2.5 MHz. The triangular waveform signal TS is sent together with the audio signal AS to a comparator 204, which compares the audio signal AS with the triangular waveform signal TS thereby generating a square wave signal DS, whose duty-cycle varies as a function of the amplitude of the audio signal AS. The square wave signal DS is then amplified by an amplifier stage 206, thereby generating an amplified square wave signal ADS.

For example, FIG. 3 shows an example of the amplifier stage 206, which comprises a half-bridge comprising two electronic switches SW1 and SW2, such as (n-channel) Field Effect Transistors (FET), connected in series between two terminals 210 and 212 adapted to receive a DC supply voltage $V_{bat}$, such as a voltage provided by a battery. Usually, the (negative) terminal 212 represent a ground GND. In the example considered, the control terminals of the switches SW1 and SW2 (e.g., the gate terminals of respective transistors) are driven as a function of the digital signal DS. For example, in the example considered are shown two driver circuits 2062 and 2064 for the electronic switches SW1 and SW2, and a control circuit 2060 configured to generate the control signals for the driver circuits 2062 and 2064 as a function of the digital signal DS. Substantially, the amplifier 206 is configured to convert the amplitude of the digital signal DS to the value of the voltage received at the terminals 210 and 212, which generally is greater than the voltage of the digital signal DS. For example, the level of the signal DS may be 3 VDC and the voltage $V_{bat}$ may be 12 VDC. Accordingly, the square wave signal ADS at the intermediate point between the two switches SW1 and SW2 corresponds to an amplified version of the signal DS.

Finally, the amplified square wave signal ADS is sent to a low-pass or bandpass filter 208, which removes at least the high-frequency spectrum from the amplified signal square wave signal ADS, thereby generating an amplified audio signal AAS, which is proportional to the original audio signal AS.

For example, FIG. 4 shows an example a LC filter 208. Generally, the filter stage 208 comprises two input terminals for receiving the signal ADS provided by the amplifier stage 206, e.g., the input terminals are connected the intermediate point of the half-bridge and the ground GND shown in FIG. 3. Moreover, the filter stage 208 comprises two output terminals for connection to the speaker SPK. Specifically, in the example considered, the first input terminal is connected to the first output terminal via an inductor L, and the second input terminal and the second output terminal are short circuited to ground GND. Finally, a capacitance C is connected in parallel with the output, i.e., between the output terminals. Substantially similar (active or passive) low-pass or bandpass filters 208 are provided in most audio amplifier circuits and/or may be integrated also within the speaker SPK.

Accordingly, a class-D amplifier is based on the fact that the switching frequency of the amplifier 20 is significantly higher than the usual audio band (between 20 Hz and 20 kHz) and accordingly the high switching frequency may be filtered with the filter stage 208, thereby reconstructing the profile of the original audio signal AS.

In the context of digital audio data, the signal generator 10 may comprise an analog-to-digital converter (ADC) for generating the signal AS or the signal generator 10 may provide directly the digital signal DS. Accordingly, the blocks 202 and 204 are purely optional.

Generally, the audio system may also use a plurality of speakers SPK, such as two or four, with respective audio amplifiers 20 using different signals AS/DS.

Those of skill in the art will appreciate that the audio system usually comprises also one or more electronic converters 30 configured to generate the regulated supply voltages for the various blocks of the audio system, such as the supply voltage for the audio signal generator 10 and possibly the blocks 202 and 204 in order to generate the digital/binary signal DS, the supply signals for the control circuit 2060 and the driver circuits 2062 and 2064, etc.

For example, usually the converter 30 comprises a DC/DC converter, such as a converter configured to convert the voltage $V_{bat}$ into a lower supply voltage, such as a voltage between 1.5 and 3.3 VDC, e.g., 1.8 VDC, used by the digital circuits of the audio system and/or the low power analog processing circuits. Similarly, additional regulated voltages may be generated for the driver circuits 2062 and 2064, such as 4.5 VDC for the driver circuit 2064.

In case of a car radio, the design of the various components of the audio system may be challenging, because of the large variations of voltage $V_{bat}$ of the automotive battery. For example, during crank and dump, a typical battery voltage of 14.4V may sharply (in less than 2 ms) drop down to 4-5V or rise up to 40V. For a proper operation, the electronic converter 30 should thus be able to control the supply voltages of the audio system for all battery conditions.

SUMMARY

Various embodiments relate to electronic converters for audio systems, such as class-D audio amplifiers.

Various embodiments relate to generating a regulated voltage.

In various embodiments, the electronic converter comprises two input terminals configured to receive a supply voltage and two output terminals configured to provide a regulated voltage.

In various embodiments, the electronic converter comprises an inductor comprising a first and a second terminal. A first electronic switch is connected between the first input terminal and the first terminal of the inductor. A second electronic switch is connected between the second terminal of the inductor and the second input terminal.

In various embodiments, the electronic converter further comprises a third electronic switch connected between the second terminal of the inductor and the first output terminal and a fourth electronic switch is connected between the first terminal of the inductor and the second output terminal. A capacitor is connected between the first output terminal and the second output terminal.

In various embodiments, a control circuit monitors the voltage between the two output terminals. During a charge phase, the control circuit closes the first and the second electronic switch, thereby increasing the current flowing through the inductor. During a discharge phase, the control circuit closes the third and the fourth electronic switch, whereby the current flowing through the inductor charges the capacitor, thereby increasing the voltage between the two output terminals.

In various embodiments, the control circuit regulates the duration of the charge phase and/or the discharge phase, such that the voltage between the two output terminals corresponds to a requested value. For example, the control circuit may determine whether, at the end of the discharge phase, the voltage between the two output terminals is greater than the requested value. When, at the end of the discharge phase, the voltage between the two output terminals is smaller than the requested value, the control circuit may increase the duration of the charge phase. Conversely, when, at the end of the discharge phase, the voltage between the two output terminals is greater than the requested value, the control circuit may decrease the duration of the charge phase.

Generally, the electronic converter may also comprise one or more further outputs. For example, in various embodiments, the electronic converter comprises a further output terminal configured to provide a further regulated voltage, wherein the further regulated voltage is referred to the second input terminal, which represents a ground. A further capacitor is connected between the further output terminal and the second input terminal, wherein a further electronic switch is connected between the second terminal of the inductor and the further output terminal. In this case, the converter comprises also a fifth electronic switch connected between the first terminal of the inductor and the second input terminal. Generally, the fifth electronic switch and/or the further electronic switch may be implemented with diodes.

In this case, the control circuit may thus also regulate the further output voltage. For example, during a further discharge phase, the control circuit may close the fifth and the further electronic switch, whereby the current flowing through the inductor charges now the further capacitor, thereby increasing the voltage between the further output terminal and the second input terminal. Similarly, the control circuit may regulate the duration of the charge phase and/or the further discharge phase, such that the voltage between the further output terminal and the second input terminal corresponds to a further requested value.

For example, in various embodiments, the control circuit is configured for repeating periodically the charge phase, the discharge phase and the further discharge phase, wherein one of the discharge phases corresponds to a last discharge phase and the other of the discharge phases corresponds to an intermediate discharge phase between the charge phase and the last discharge phase.

In this case, the control circuit may stop the intermediate discharge phase when the respective voltage being increased during the intermediate discharge phase reaches the respective requested value. Moreover, the control circuit may increase the duration of the charge phase when, at the end of the last discharge phase, the respective voltage being increased during the last discharge phase is smaller than the respective requested value, and decrease the duration of the charge phase when, at the end of the last discharge phase, the respective voltage being increased during the last discharge phase is greater than the respective requested value.

Generally, the electronic converter may also control the offset of the voltage between the two output terminals with respect to the second input terminal, i.e., with respect to ground.

For example, in various embodiments, the electronic converter comprises a reference voltage generator, such as a voltage divider, configured to generate a reference voltage being preferably proportional to the supply voltage. In this case, a first resistor may be connected between the first output terminal and the reference voltage, and a second resistor may be connected between the second output terminal and the reference voltage.

In various embodiments, the electronic converter may also be configured to filter parasitic current spikes. For this purpose, the electronic converter may comprise a first capacitor connected between the first output terminal, and the first input terminal or the second input terminal. Additionally or alternatively, the electronic converter may comprise a second capacitor connected between the second output terminal, and the first input terminal or the second input terminal.

Generally, in addition or as alternative to the coupling to the reference voltage, the converter may also comprise clamp circuits for limiting the voltage offset of the two output terminals with respect to the second input terminal, i.e., with respect to ground. Specifically, the electronic converter may comprise a first clamp circuit configured to selectively permit a current flow towards the first output terminal, until the voltage between the first output terminal and the second input terminal reaches or is greater than an upper voltage. The electronic converter may comprise also a second clamp circuit configured to selectively permit a current flow from the second output terminal, until the voltage between the second output terminal and the second input terminal reaches or is smaller than a lower voltage.

BRIEF DESCRIPTION OF THE DRAWINGS

Embodiments of the present disclosure will now be described with reference to the annexed drawings, which are provided purely by way of non-limiting example and in which:

FIG. 19 shows a fifth embodiment of the electronic converter of FIG. 5;

FIGS. 20 and 21 show embodiments of clamp circuits for the electronic converter of FIG. 19;

DETAILED DESCRIPTION OF ILLUSTRATIVE EMBODIMENTS

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

In the following FIGS. 5 to 23, parts, elements or components which have already been described with reference to FIGS. 1 to 4 are denoted by the same references previously used in such Figures. The description of such previously described elements will not be repeated in the following in order not to overburden the present detailed description.

As mentioned before, various embodiments of the present application relate to an electronic converter, such as electronic converter 30a for an audio system (see also the description of FIGS. 1 to 4).

Figure 5:
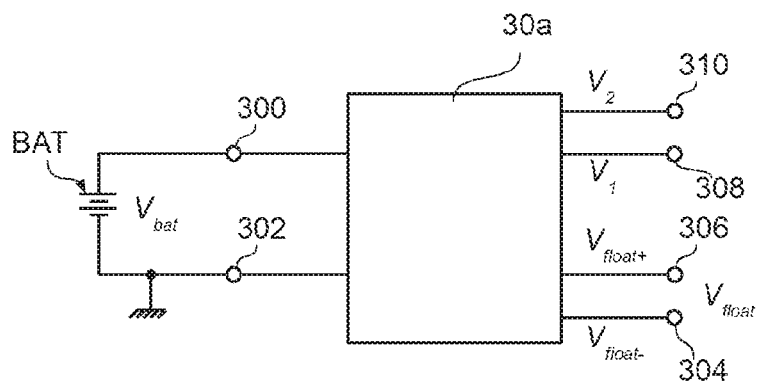
FIG. 5 shows an embodiment of an electronic converter configured to generate a regulated voltage in accordance with the present disclosure.

FIG. 5 shows the general architecture of an embodiment of the electronic converter 30a. Generally, the electronic converter 30a comprises two input terminals 300 and 302 for connection to a DC supply voltage $V_{bat}$, where the negative terminal 302 represent a ground GND. For example, the terminals 300 and 302 may be connected to a battery BAT, such as the battery of a vehicle, such as a car.

Figure 1:
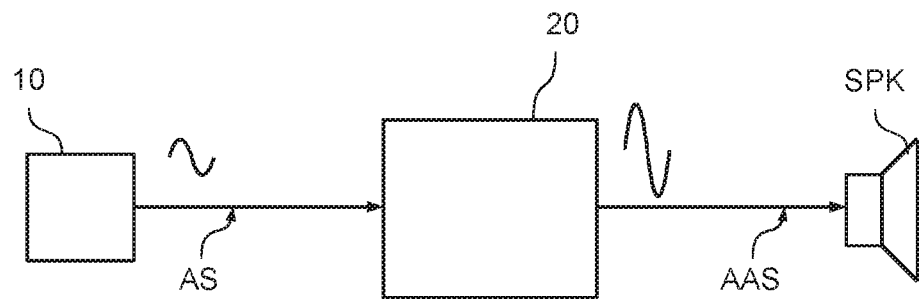
FIGS. 1-4 have already been described in the foregoing.
Figure 2:
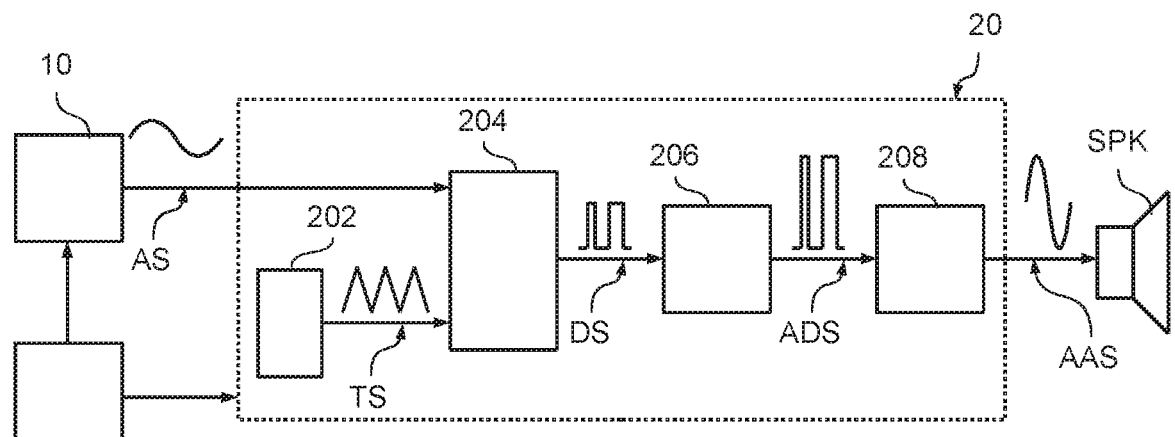
Figure 3:
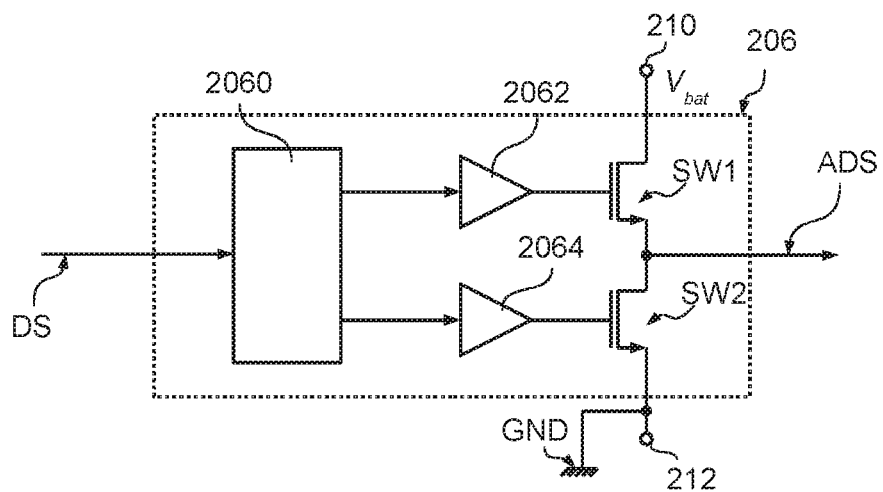
Figure 4:
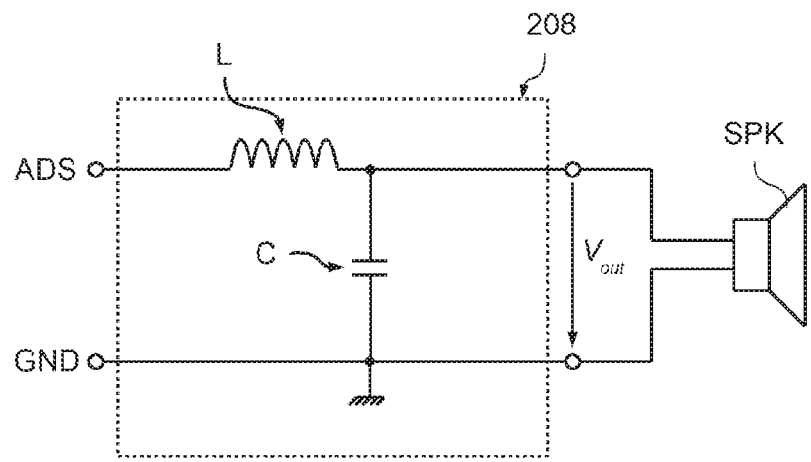

In the embodiment considered, the electronic converter 30a comprises at least two output terminals 304 and 306 for providing a regulated voltage $V_{float}$, which may, e.g., be used to power one or more digital/analog circuits, such as the signal generator 10, and/or the blocks 202, 206 and/or the control circuit 2060 described in with respect to FIG. 2.

Specifically, in various embodiments, the voltage at the terminal 304 is not connected directly to ground GND, i.e., the voltage $V_{float-}$ between the (negative) terminal 304 and ground GND is not zero. However, the electronic converter 30a is configured to generate a regulated and substantially constant voltage $V_{float}$ between the terminals 304 and 306, such as 1.8 VDC.

Specifically, in various applications it may be desirable that the voltage $V_{float}$ is referred to a reference voltage $V_{ref}$, which is smaller than the voltage $V_{bat}$, i.e.:

$$0<V_{ref}<V_{bat}$$

Specifically, in various embodiments, the converter 30a generates a voltage $V_{float+}$ between the positive terminal 306 and ground GND, which corresponds to:

$$V_{float+}=V_{ref}+V_{float}/2.$$

and a voltage $V_{float-}$ between the negative terminal 304 and ground GND which corresponds to:

$$V_{float-}=V_{ref}-V_{float}/2$$

whereby the voltage between the (positive) terminal 306 and the (negative) terminal 304 corresponds to $V_{float}$.

For example, in various embodiments, the reference voltage $V_{ref}$ is variable and set to 50% of the supply voltage $V_{bat}$ (or generally $V_{ref}=x*V_{bat}$, with $0<x<1$). For example, the reference voltage $V_{ref}$ may be provided by an additional voltage regulator or a voltage divider.

Generally, such a floating voltage $V_{float}$ may be useful in many applications.

For example, in the case of an audio system, such a floating voltage $V_{float}$ may be used by the analog circuits, in particular by the circuit 2060, in order to improve the quality of the audio signal, in particular with respect to the signal/noise ratio. For example, this simplifies the implementation of unity-gain amplifier (as described, e.g., in documents Maxim, "APPLICATION NOTE 3977—Class D Amplifiers: Fundamentals of Operation and Recent Developments", Jan. 31, 2007, available at https://www.maximintegrated-.com/en/app-notes/index.mvp/id/3977, or U.S. Pat. No. 8,558,618 B2, which are incorporated herein by reference) because the voltage gain of the amplifier stage 206 is unitary. Similarly, also the digital circuits may work with the floating voltage $V_{float}$ in order to simplify the interface between the digital and analog circuits.

Figure 6:
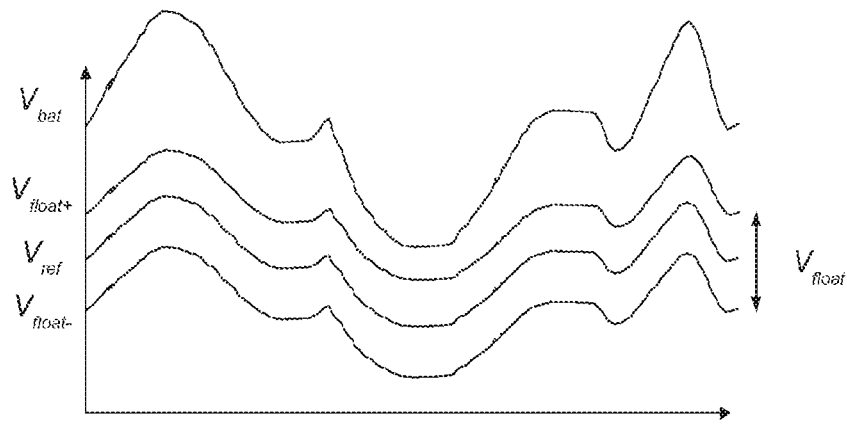
FIG. 6 shows an exemplary waveform of the regulated voltage generated by the electronic converter of FIG. 5.

For example, FIG. 6 shows exemplary waveform for the supply voltage $V_{bat}$, the reference voltage $V_{ref}$ and the voltages $V_{float+}$ and $V_{float-}$ (referred to ground GND).

As mentioned before, in case the converter 30a is powered via a vehicle battery BAT, the variation of the supply voltage $V_{bat}$ may be fast (<2 ms). In various embodiments, the converter 30a should thus be able to generate voltages $V_{float+}$ and $V_{float-}$ following such voltage variations. For example, this implies that the capacitances associated with the terminals 304 and 306 with respect to ground GND should be small.

In various embodiments (see, e.g., FIG. 5), the electronic converter 30a may also comprise one or more additional output terminals, such as terminals 308 and 310, for providing one or more additional supply voltages, such as voltages $V_1$ and $V_2$, which, e.g., may be used to power the driver circuits 2062 and 2054 arranged to drive the switches of a half-bridge. Generally, only a single terminal may be required for these voltages $V_1$ and $V_2$, insofar as these voltages may be referred to ground GND.

Accordingly, in various embodiments, the converter 30a receives at input a variable input voltage $V_{bat}$ and provides at output one or more voltages, which generally may be smaller or greater than the input voltage $V_{bat}$. Thus, generally, a plurality of electronic converters may be used, wherein each electronic converter is configured to generate a respective one of the voltages $V_{float+}$, $V_{float-}$, $V_1$ and $V_2$.

Figure 7:
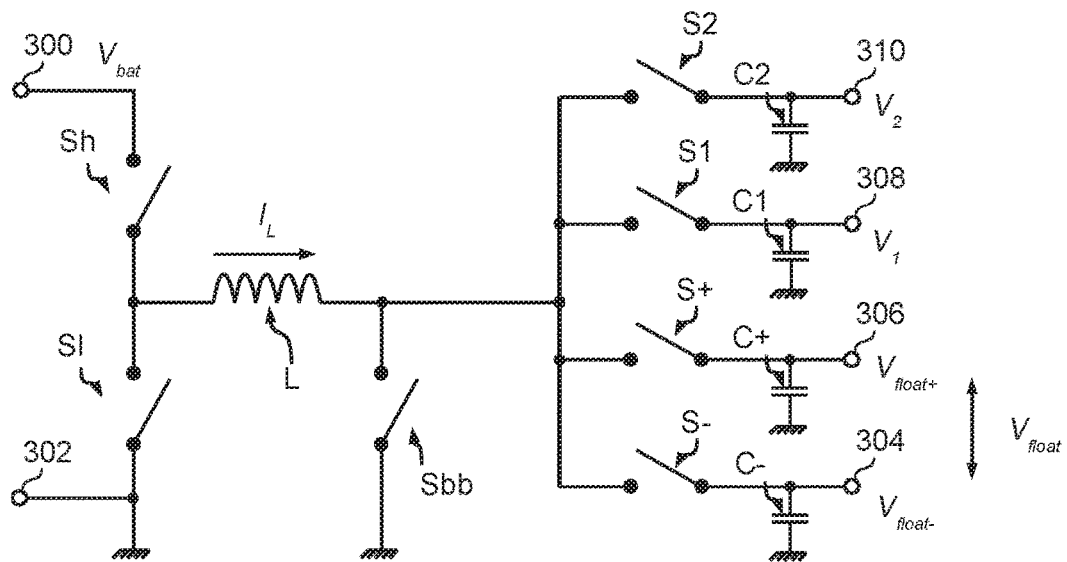
FIG. 7 shows a first embodiment of the electronic converter of FIG. 5.

Conversely FIG. 7 shows an embodiment of an electronic converter 30a configured to generate a plurality of the voltages $V_{float+}$, $V_{float-}$, $V_1$ and $V_2$.

Specifically, in the embodiment considered, a so called Single-Inductor Multiple-Output (SIMO) architecture is used. As the term implies, in this case, the electronic converter 30a comprises a single inductor L.

Specifically, in the embodiment considered, the electronic converter 30a comprise a half-bridge comprising two electronic switches Sh and Sl, such as (e.g., n-channel) FETs, connected (e.g., directly) in series between the terminals 300 and 302 arranged to receive the supply voltage $V_{bat}$, i.e., the terminals 300 and 302 may be connected (directly or via a cable) to the battery BAT.

In the embodiment considered, a first terminal of the inductor L is connected (e.g., directly) to the intermediate point between the switches Sl and Sh. The second terminal of the inductor L is connected (e.g., directly) via a further electronic switch Sbb to the negative terminal 302. Moreover, the second terminal of the inductor L is also connected (e.g., directly) via a respective switch, such as a (e.g., n-channel) FET, to each of the output terminals of the electronic converter 30a, i.e., the terminals 304, 306 and the optional terminals 308 and/or 310 For example, in the embodiment considered, the electronic converter 30a comprises:

an electronic switch S− connected (e.g., directly) between the second terminal of the inductor L and the terminal 304 providing the voltage $V_{float-}$;

an electronic switch S+ connected (e.g., directly) between the second terminal of the inductor L and the terminal 306 providing the voltage $V_{float+}$;

optionally an electronic switch S1 connected (e.g., directly) between the second terminal of the inductor L and the terminal 306 providing the voltage $V_1$; and optionally an electronic switch S2 connected (e.g., directly) between the second terminal of the inductor L and the terminal 308 providing the voltage $V_2$.

In various embodiments, each of the switches S−, S+, S1 and S2 may ensure that current may flow form the second inductor terminal towards the respective output terminal. For this purpose, each of the switches may be:

a bidirectional switch, e.g., by using two field effect transistors connected in opposite direction in series, e.g., in case of n-channel FET the drain of a first FET may be connected to the second inductor terminal, the drain of a second FET may be connected to the respective output terminal, and the source terminals of the two FETs may be connected together; or an unidirectional switch, e.g., by connecting a diode in series with a FET.

Moreover, as will be described in the following, the electronic switch associated with the output terminal 304, 306, etc., providing the highest output voltage (e.g., switch S2 associated with the terminal 310 providing the voltage $V_2$ to the driver circuit 2062) may also be implemented with a diode.

In the embodiment considered, a respective capacitor C+, C−, C1 and C2 is associated with each of the output terminals. Specifically, in the embodiment considered, each terminal 304, 306, 308 and 310 is connected (e.g., directly) via the respective capacitor C+, C−, C1 or C2 to ground GND.

Figure 8:
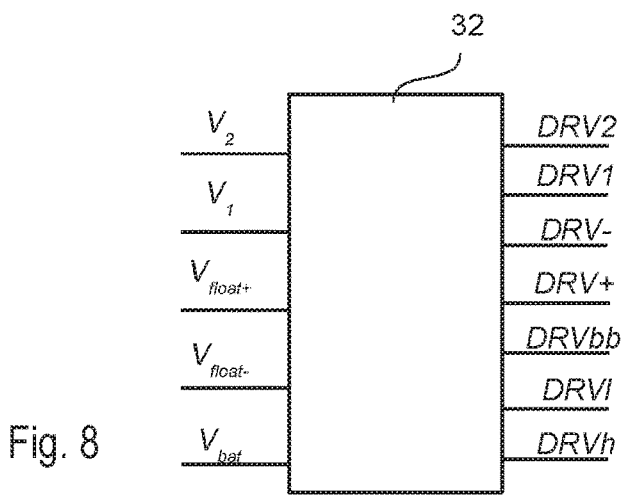
FIG. 8 shows an embodiment of a control circuit of the electronic converter of FIG. 7.

As shown in FIG. 8, the electronic converter 30a comprises also a control circuit 32 configured to generate drive signals DRVh, DRVl, DRVbb, DRV−, DRV+, DRV1 and DRV2 configured to drive the switches Sh, Sl, Sbb, S−, S+, S1 and S2, respectively, as a function of the output voltages $V_{float-}$, $V_{float+}$, $V_1$ and $V_2$, and the respective requested output voltages (not shown in FIG. 8).

Generally, by driving the switches in an appropriate manner, the converter 30a may be operated as buck (step-down), boost (step-up) or buck-boost converter.

Figure 9A:
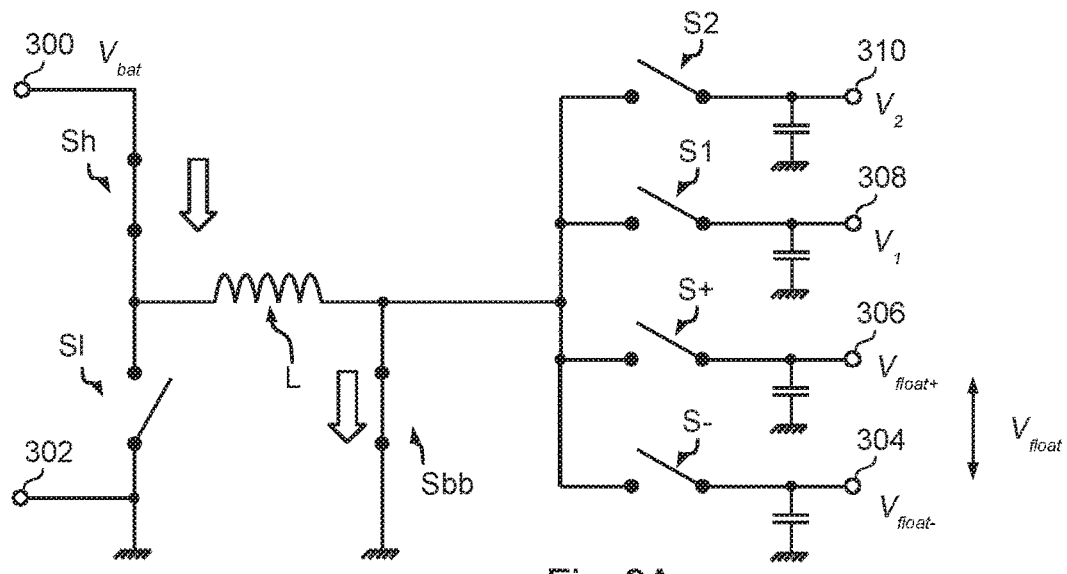
FIGS. 9A and 9B show possible switching states of the electronic converter of FIG. 7.
Figure 9B:
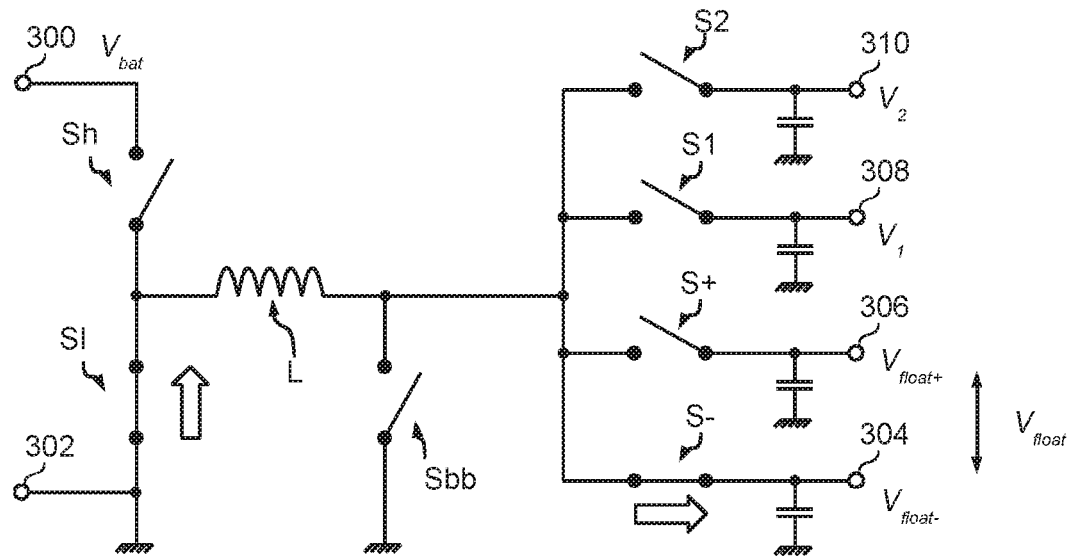
Figure 10:
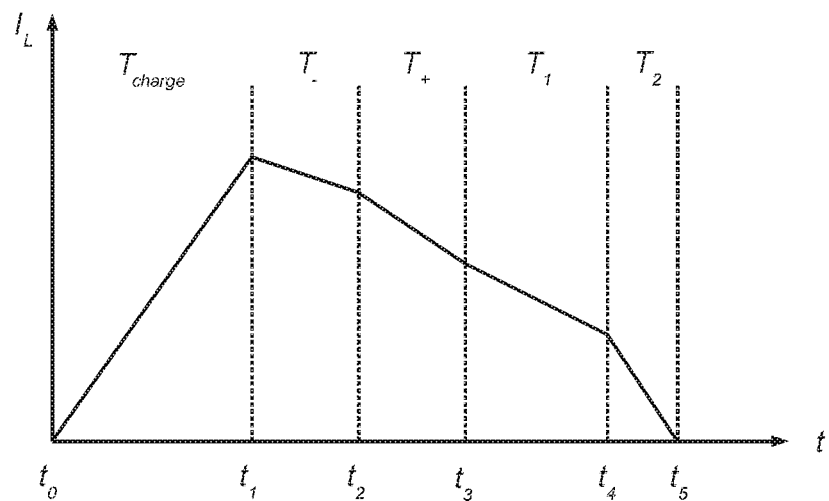
FIG. 10 shows a waveform of the behavior of the electronic converter of FIG. 7.

For example, at the example of FIGS. 9A, 9B and 10 will be described a possible operation of the control circuit 32. Specifically, FIGS. 9A and 9B show two exemplary switching states of the converter of FIG. 7. FIG. 10 shows a possible waveform of the current $I_L$ flowing through the inductor L.

In the embodiment considered, the control circuit 32 closes at an instant $t_0$ and for a charge time $T_{charge}$ the switches Sh and Sbb and maintains opened the other switches (see FIG. 9A). Accordingly, during this phase the inductor L is connected to the supply voltage $V_{bat}$ and the current $I_L$ increase substantially linearly.

At the end of the charge interval $T_{charge}$, i.e., at an instant $t_1$, the control circuit 32 opened the switches Sh and Sbb, and closes the switch Sl and one of the output switches S+, S−, S1 or S2 associated with the outputs, such as the switch S− (see FIG. 9B). Accordingly, during a following time interval T− the inductor current $I_L$ flows to the output 304 and the voltage $V_{float-}$ increase, while the current $I_L$ decrease substantially linearly.

At an instant $t_2$, e.g., when the voltage $V_{float-}$ has reached the requested value, the control circuit 32 opened the previously closed output switch, e.g., the switch S−, and closes a next output switch, such as the switch S+. Accordingly, during a following time interval $T_+$ the inductor current $I_L$ flows to the output 306 and the voltage $V_{float+}$ increase, while the current $I_L$ decrease substantially linearly.

At an instant $t_3$, e.g., when the voltage $V_{float+}$ has reached the requested value, the control circuit 32 opened the previously closed output switch, e.g., the switch S+, and closes a next output switch, such as the switch S1. Accordingly, during a following time interval $T_1$ the inductor current $I_L$ flows to the output 308 and the voltage $V_1$ increase, while the current $I_L$ decrease substantially linearly.

At an instant $t_4$, e.g., when the voltage $V_1$ has reached the requested value, the control circuit 32 opened the previously closed output switch, e.g., the switch S1, and closes a next output switch, such as the switch S2. Accordingly, during a following time interval $T_2$ the inductor current $I_L$ flows to the output 310 and the voltage $V_2$ increase, while the current $I_L$ decrease substantially linearly.

At an instant $t_5$, e.g., when the voltage $V_2$ has reached the requested value, the control circuit 32 opened the previously closed output switch, e.g., the switch S2.

Generally, the sequence of the various discharge phases $T_+$, $T_-$, $T_1$, and $T_2$ may also be different, and the converter may use more or less phases in order to provide more or less output voltages.

The control circuit 32 may start a new cycle $T_{charge}$ at a fixed frequency or immediately with the instant $t_5$. The former being usually referred to as Pulse Width Modulation (PWM) mode, while the latter is usually called quasi resonant mode.

Specifically, in various embodiments, apart from regulating the durations of the various discharge phases, the control circuit 32 also regulates the duration of the charge phase $T_{charge}$ in order to ensure that sufficient energy is stored in the inductor L in order to reach the requested output voltages. For example, the control circuit 32 may use for this purpose the voltage at the output terminal corresponding to the last discharge phase, e.g., the voltage $V_2$ terminal 310.

For example, the control circuit 32 may increase the duration of the charge phase $T_{charge}$ when:

the inductor current $I_L$ reaches zero and the voltage is smaller than the requested value, or a new switching cycle starts with fixed frequency and the voltage is smaller than the requested value.

Similarly, the control circuit 32 may decrease the duration of the charge phase $T_{charge}$ when:

the voltage reaches the requested value and the inductor current $I_L$ is greater than zero, or in a complementary manner the inductor current $I_L$ reaches zero and the voltage is greater than the requested value, or a new switching cycle starts with fixed frequency and the voltage is greater than the requested value.

Thus, in the embodiment considered, the control circuit 32 may use a fixed reference values for the voltages $V_1$ and $V_2$, thereby providing substantially constant voltages $V_1$ and $V_2$. Conversely, the control circuit 32 may use variable reference values for the voltages $V_{float+}$ and $V_{float-}$ determined as a function of the voltage $V_{bat}$, thereby providing variable voltages $V_{float+}$ and $V_{float-}$, where the voltage $V_{float}$ between the terminals 304 and 306 is substantially constant (as described in the foregoing).

Generally, instead of using a single charge phase $T_{charge}$, the converter may use also a plurality of charge phases, e.g., a respective charge phase for each discharge phase. For example, in this case, the electronic converter 30a may be operated as a buck-boost converter, where a plurality of outputs is regulated sequentially. Accordingly, in the embodiment considered, the electronic converter 30a is used in a time-sharing mode, where the switches Sh, Sl and Sbb and the inductor L are sequentially used to provide power to one of the output capacitors (by closing one of the switches S−, S+, S1 or S2).

Again, as mentioned in the foregoing, the electronic converter 30a could also generate only the voltages $V_{float+}$ and $V_{float-}$. Moreover, based on the values of the supply voltage $V_{bat}$ and the requested output voltages, the control circuit 32 may operate the switches in order to implement other converter topologies, which control the current flowing through the inductor L, such as:

a buck converter, where the switch Sbb remains opened, and the control circuit 32 closes alternatively the switches Sh and Sl, e.g., in order to generate a voltage $V_1$ being smaller than the supply voltage $V_{bat}$; and a boost converter, where the switch Sh remains closed and the switch Sl remains opened, and the control circuit 32 closes alternatively the switch Sbb and, e.g., the switch S2 in order to generate a voltage $V_2$ being greater than the supply voltage $V_{bat}$.

In various embodiments, due to the fact that the voltages $V_{float+}$ and $V_{float-}$ are between the minimum and the maximum value of the supply voltage $V_{bat}$, the control circuit 32 operates at least for these voltages the converter 30a as buck-boost converter as described in the foregoing.

While the solution described in the foregoing is a valid solution in order to generate constant or almost constant output voltage, e.g., the voltages $V_1$ and $V_2$, the solution may present some drawbacks for the generation of variable voltages, such as the voltages $V_{float+}$ and $V_{float-}$. For example, as mentioned in the foregoing, the supply voltage $V_{bat}$ and thus the reference voltage $V_{ref}$ may vary fast (<2 ms). Thus, the electronic converter 30a should be able to provide also voltages $V_{float+}$ and $V_{float-}$, which are able to follow these variations. However, the architecture shown in FIG. 7 requires the tank/output capacitors C+ and C−, which are charged by the current $I_L$. Moreover, the converter is operated sequentially with the time-sharing technique. Thus, the output capacitors may not be too small. For example, the capacitances of the capacitors C1 and C2 may be between 5 e 100 uF, e.g., approximately 10 uF. Thus, in order to follow variations having a frequency being greater than 100 Hz, large charge or discharge currents would be required, which would render the system less efficient.

Moreover, the voltages $V_{float+}$ and $V_{float-}$ are regulated independently, thereby using two separate control loops. These loops have to ensure a sufficient precision in order to obtain the requested voltage $V_{float}$.

Figure 11:
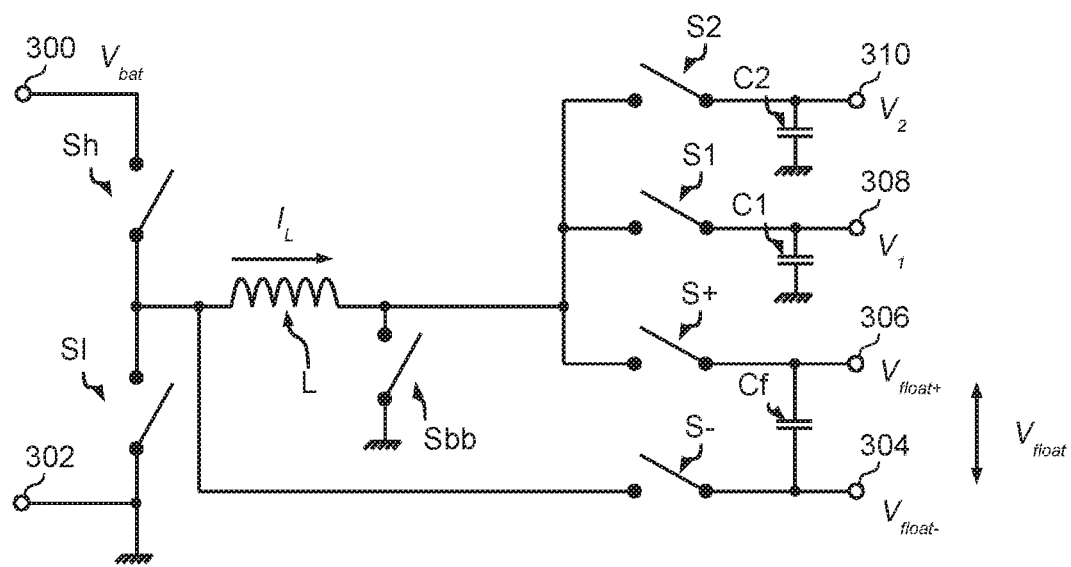
FIG. 11 shows a second embodiment of the electronic converter of FIG. 5.

FIG. 11 shows thus a second embodiment of the electronic converter 30a. Specifically, in the embodiment considered, the electronic switch S− associated with the terminal 304 providing the voltage $V_{float-}$ is not connected anymore to the second terminal of the inductor L, but to the first terminal of the inductor L, i.e., the intermediate point between the switches Sh and Sl of the half-bridge. Moreover, a single capacitor Cf is connected between the terminals 304 and 306. In some embodiments, the capacitors C+ and C− are preferably omitted.

Figure 14A:
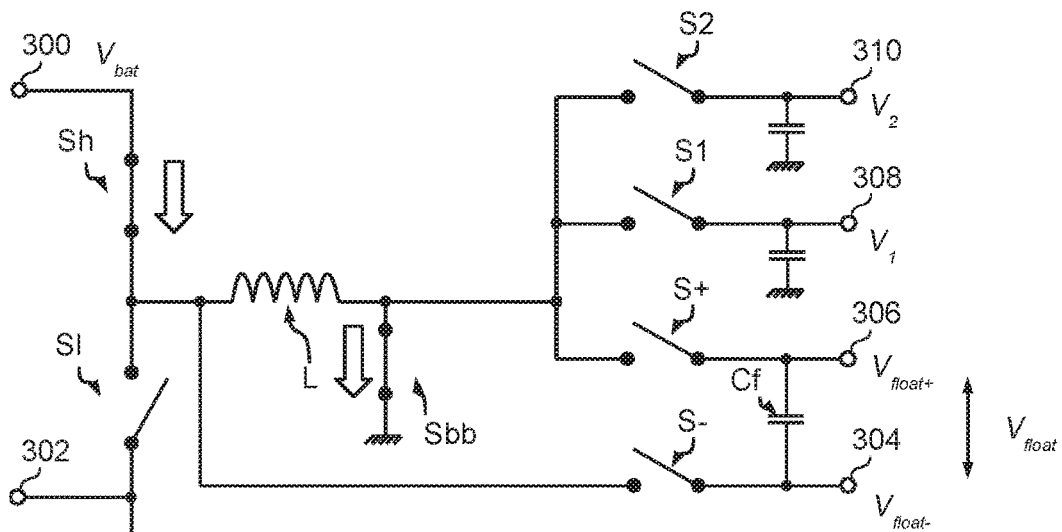
FIGS. 14A, 14B and 14C show possible switching states of the electronic converter of FIG. 11.
Figure 14B:
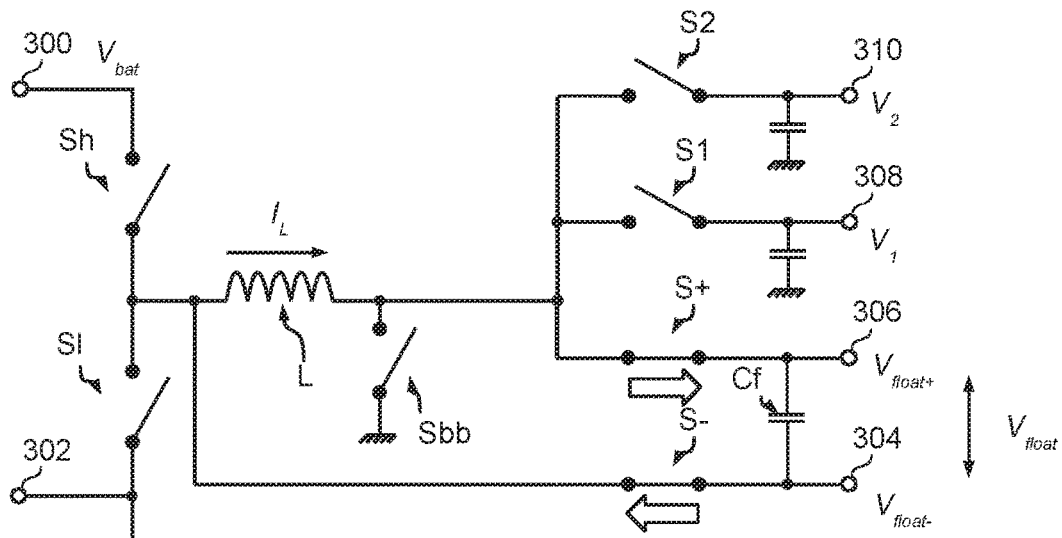
Figure 14C:
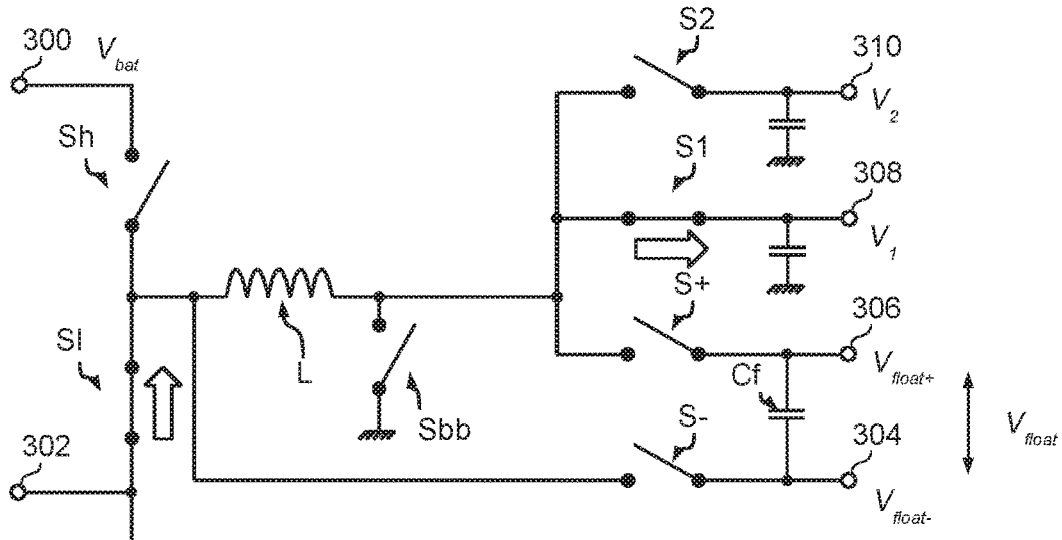

FIG. 13 shows again a possible waveform of the current $I_L$ flowing through the inductor L, and FIGS. 14a, 14b and 14c show various switching stages of the converter 30a.

Specifically, the control circuit 32 closes again at an instant $t_0$ and for a charge time $T_{charge}$ the switches Sh and Sbb and maintains opened the other switches (see FIG. 14A). Accordingly, during this phase the current $I_L$ increase substantially linearly. At an instant $t_1$, the control circuit 32 opens thus the switches Sh and Sbb and the charge phase ends.

Figure 12:
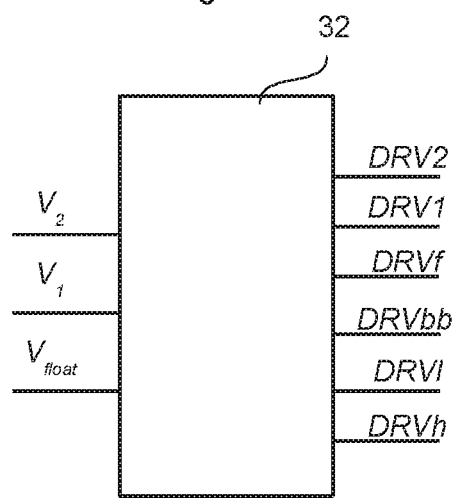
FIG. 12 shows an embodiment of a control circuit of the electronic converter of FIG. 11.
Figure 13:
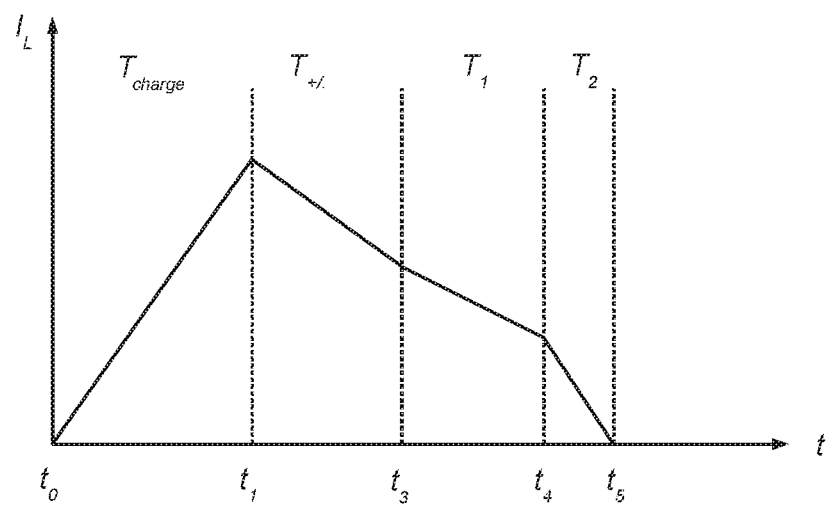
FIG. 13 shows a waveform of the behavior of the electronic converter of FIG. 11.

During the following discharge phases, the energy stored in the inductor L is then provided to the output terminals. Specifically, during one of the discharge phases $T_{+/-}$, e.g., the first discharge phase, the control circuit 32 drives the control terminal of the switches S+ and S− in order to close these switches, e.g., at the instant $t_1$ (see FIG. 14B). Accordingly, in this embodiment, the switches S+ and S− are closed during the same phase. As shown in FIG. 12, the control circuit 32 may thus generate (in addition to the drive signals DRVh, DRVl, DRVbb, DRV1 and DRV2 configured to drive the switches Sh, Sl, Sbb, S1 and S2, respectively) a common drive signal DRVf, which drives simultaneously the switches S+ and S−. Moreover, as shown in FIG. 12, in the embodiment considered, the control circuit 32 receives at input directly the voltage difference $V_{float}$.

Specifically, when both switches S+ and S− are closed, the inductor current $I_L$ will flow from the terminal 304 to the terminal 306, thereby charging the capacitor Cf. Thus, the voltage $V_{float-}$ will decrease and the voltage $V_{float-}$ will increase, whereby the $V_{float}$ between the terminals 304 and 306 will increase. Thus, in the embodiment considered, the current $I_L$ decrease substantially linearly and the control circuit 32 may switch off the switches S+ and S− at an instant $t_3$ directly when the voltage $V_{float}$ reaches the requested constant value. Generally, in case unidirectional switches are used for the switches S+ and S−, these switches should support the mentioned current flow direction, i.e., the switch S− should be configured to permit a current flow from the terminal 304 towards the first terminal of the inductor L (as a function of the respective drive signal DRV−/DRVf) and the switch S+ should be configured to permit a current flow from the second terminal of the inductor L towards the terminal 306 (as a function of the respective drive signal DRV+/DRVf).

Thus, at the instant $t_3$, the control circuit 32 opened the previously closed output switches S+ and S−, and closes the switch Sl and one of the other output switches, such as the switch S1 (see FIG. 14C). Accordingly, as in the previous embodiment, during a following time interval $T_1$ the inductor current $I_L$ flows now from ground GND (via the switches Sl an S1) to the output 308 and the voltage $V_1$ increase, while the current $I_L$ decrease substantially linearly.

At an instant $t_4$, e.g., when the voltage $V_1$ has reached the requested value, the control circuit 32 opened the previously closed output switch, e.g., the switch S1, and closes a next output switch, such as the switch S2. Accordingly, during a following time interval $T_2$ the inductor current $I_L$ flows to the output 310 and the voltage $V_2$ increase, while the current $I_L$ decrease substantially linearly.

At an instant $t_5$, e.g., when the voltage $V_2$ has reached the requested value, the control circuit 32 opened the previously closed output switch, e.g., the switch S2.

Again, the sequence of the various discharge phases $T_{+/-}$, $T_1$, and $T_2$ may also be different, and the converter may use more or less phases in order to provide more or less output voltages. Moreover, also in this case, a plurality of charge phase may be used, such as a respective charge phase for each discharge phase.

Thus, in the embodiment considered, during one of the discharge phases, both switches S+ and S− are closed (while the other switches Sh, Sl, Sbb, S1 and S2 are opened). Thus, in the embodiment considered, the inductor current $I_L$ charges the capacitor Cf and the control circuit may directly regulate the output voltage $V_{float}$.

Again, considering the voltage levels at the inductor L, the switch Sl and/or the switch connected to the output terminal providing the highest output voltage (e.g., the switch S2) may also be implemented with a diode, and the control unit 302 may thus not generate the respective drive signals, e.g., the drive signal DRV1 for the switch Sl and the drive signal DRV2 for the switch S2.

In the embodiment shown in FIGS. 11 and 12, the control circuit 32 regulates only the voltage difference between the terminals 304 and 306, i.e., the voltage $V_{float}$. However, the control circuit 32 does not regulate the offset of the voltages $V_{float+}$ and $V_{float-}$ with respect to ground GND.

Generally, the control circuit 32 could thus also regulate the voltages $V_{float+}$ and $V_{float-}$ with respect to ground GND. For example, in an embodiment, the control circuit 32 could close both switches S+ and S− until either the voltage $V_{float+}$ or the voltage $V_{float-}$ reaches the requested reference value ($V_{ref}+/-V_{float}/2$), and then either:

when the voltage $V_{float+}$ has reached the requested voltage ($V_{ref}+V_{float}/2$), continue to discharge the terminal 302 towards ground GND (e.g., by closing the switch Sbb) or towards one of the other output terminals (e.g., via the switch S1 or S2); or when the voltage $V_{float-}$ has reached the requested voltage ($V_{ref}-V_{float}/2$), continue to charge the terminal 304 from ground GND e.g., by opening the switch S− and closing the switch Sl.

Unfortunately, this control is rather complex and instead of using a single capacitor Cf, two capacitors C+ and C− would again be required. Substantially, in this case, the voltages $V_{float+}$ and $V_{float-}$ would have to be regulated again individually, with the associated complexity to obtain the requested variable values.

Figure 15:
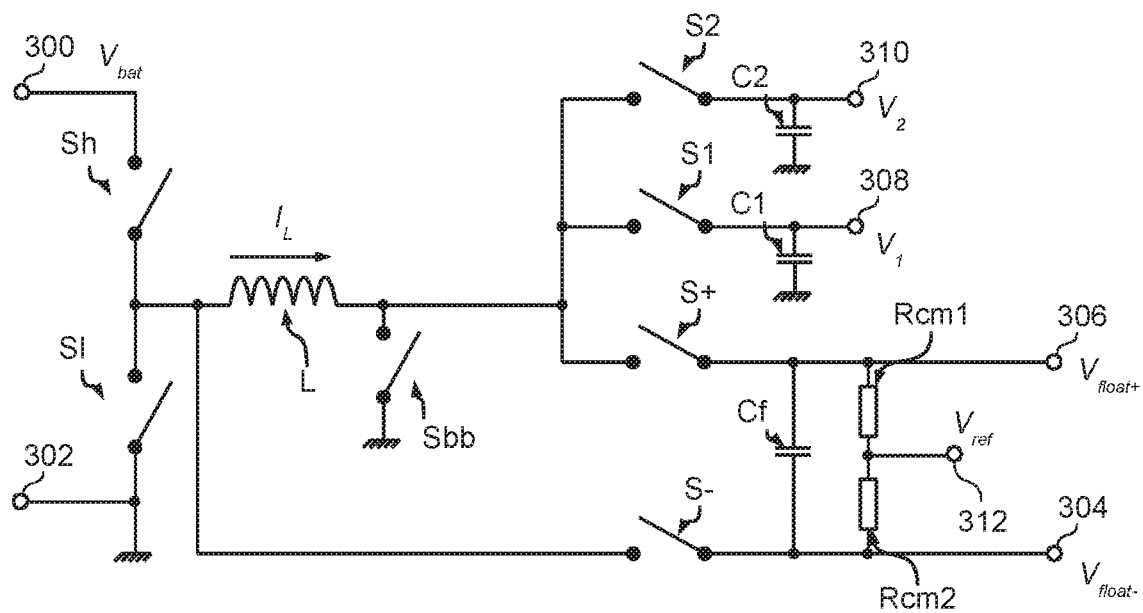
FIG. 15 shows a third embodiment of the electronic converter of FIG. 5.

FIG. 15 shows an embodiment, which permits a simplified control of voltage offset of the voltages $V_{float+}$ and $V_{float-}$. Specifically, in the embodiment considered, the control circuit 32 regulates the duration of the interval $T_{+/-}$ in order to obtain the requested voltage difference $V_{float}$ (as described with respect to FIGS. 11-14), however, the control circuit 32 does not regulate the voltage $V_{float+}$ and $V_{float-}$ with respect to ground GND. Conversely, the offset of these voltages $V_{float+}$ and $V_{float-}$ is imposed separately by coupling the terminals 302 and 304 to the reference voltage $V_{ref}$, representing a common mode for the terminals 302 and 304.

In various embodiments (see FIG. 16), the converter 30a may thus comprise a circuit 34 configured to generate the voltage $V_{ref}$ at a node/terminal 312 as a function of the voltage $V_{bat}$. For example, in various embodiments, the circuit 34 comprises a resistive voltage divider comprising two resistors $R_{ref1}$ and $R_{ref2}$ connected (e.g., directly) between the terminals 300 and 302. Accordingly, in the embodiment considered, the voltage $V_{ref}$ at the intermediate point between the two resistors $R_{ref1}$ and $R_{ref2}$ (representing the node/terminal 312 in the embodiment considered) will be proportional to the supply voltage $V_{bat}$ based on the values of the resistors $R_{ref1}$ and $R_{ref2}$. For example, in various embodiments, the resistors $R_{ref1}$ and $R_{ref2}$ have substantially the same value. Generally, the circuit 34 may also comprise more complex circuits for implementing a reference voltage generator, possibly comprising also amplifier stages (such as one or more operation amplifiers and/or current mirrors) in order to ensure a stable output voltage $V_{ref}$ for different load conditions at the node/terminal 312.

In the embodiments considered, the terminals 304 and 306 are coupled to the voltage $V_{ref}$ via respective resistors Rcm1 and Rcm2, i.e., a resistor Rcm1 is connected (e.g., directly) between the terminal 306 and the terminal 312 providing the voltage $V_{ref}$ (e.g., the intermediate point between the resistors Rref1 and Rref2) and a resistor Rcm2 is connected (e.g., directly) between the terminal 304 and the terminal 312. In order to obtain the voltages $V_{ref}+/-V_{float}/2$ the resistors Rcm1 and Rcm2 should have the same value. However, generally the resistors could also have different values, e.g., when a different scaling with respect to the ground GND is requested.

For example, assuming a switching frequency of 2 MHz, the inductance of the inductor L may be 10 µH, the capacitance of the capacitor Cf may be 10 µF, the resistances of the resistors Rcm1 and Rcm2 may be 10 kΩ, and the resistances of the resistors Rref1 and Rref2 may be 10 kΩ. Accordingly, typically the inductor L, the capacitor Cf and the resistors Rcm1, Rcm2, Rref1 and Rref2 have values in the micro-henry (μH)/micro-farad (μF)/kilo-ohm (kΩ) range, respectively.

Figure 16:
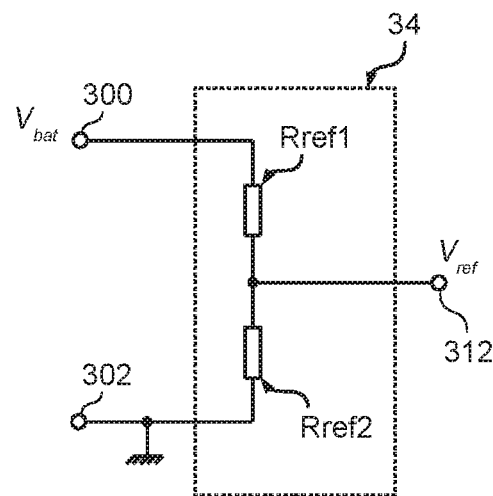
FIG. 16 shows an embodiment of a reference voltage generator for the electronic converter of FIG. 15.

The inventors have observed that the solution described with respect to FIGS. 15 and 16 is a valid solution, in particular when no high precision of the offsets $V_{float+}$ and $V_{float-}$ with respect to the ground GND is required. From a practical point of view, the circuit will, however, comprise also parasitic capacitance, such as capacitances associated with the first and second terminal of the inductor L.

Figure 17:
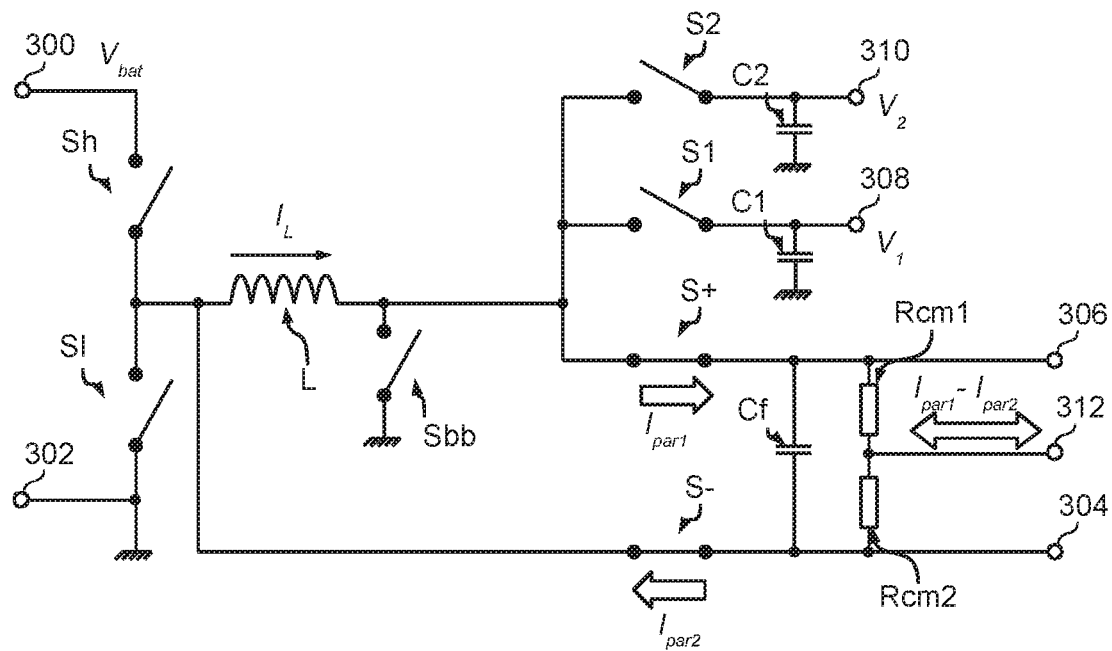
FIG. 17 show details of the parasitic behaviors of the electronic converter of FIG. 15.

For example, this is shown in FIG. 17, wherein parasitic currents $I_{par1}$ and $I_{par2}$ are flowing through the switches S+ and S−, respectively. Specifically, these parasitic currents $I_{par1}$ and $I_{par2}$ do not flow through the inductor L but towards the positive supply voltage $V_{bat}$ and/or ground GND. The inventors have observed that (based on the implementation of the switches S+ and S−) usually these parasitic current $I_{par1}$ and $I_{par2}$ flow only during a brief interval at the instant $t_1$ when the switches S+ and S− are closed, i.e., the duration of the current pulses is significantly smaller than the duration of the interval $T_{+/-}$. In principle, these parasitic currents $I_{par1}$ and $I_{par2}$ would not represent any particular issue, when their amplitude would be the same. However, in case the values are different, a current $(I_{par1}-I_{par2})$ will also flow towards the node 312 providing the reference voltage $V_{ref}$. For example, in case the reference voltage $V_{ref}$ is provided by a voltage divider (see FIG. 16), this current will vary the reference voltage $V_{ref}$ from the requested value.

Figure 18:
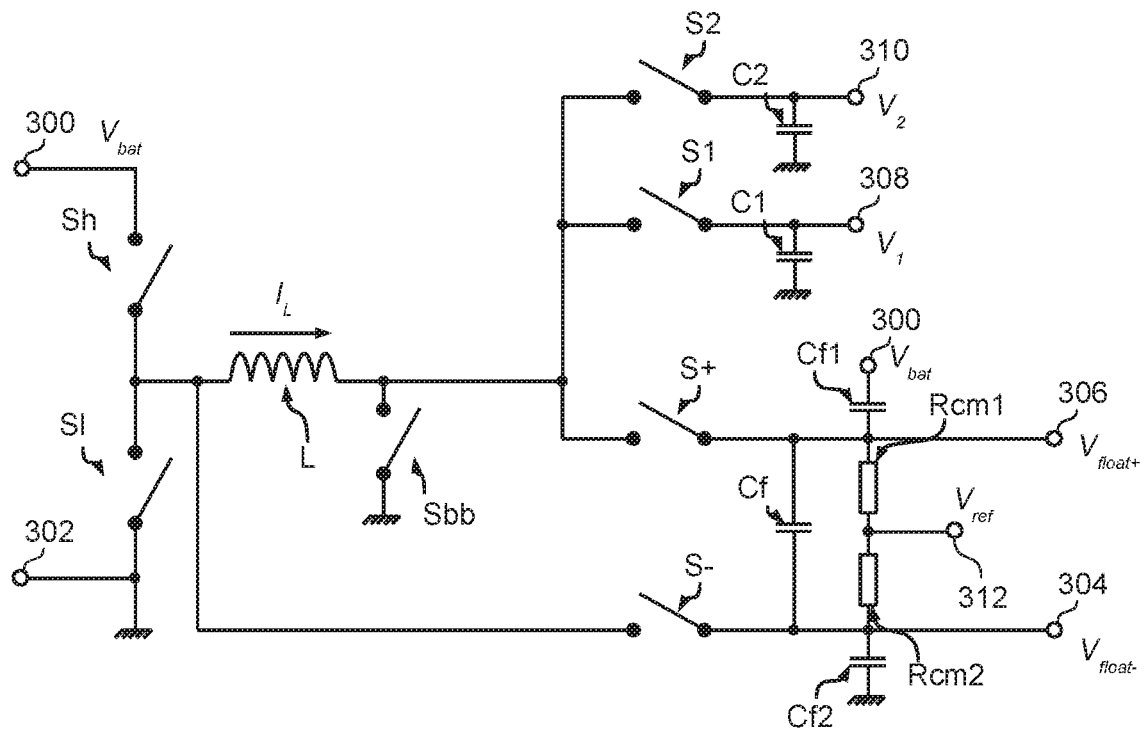
FIG. 18 shows a fourth embodiment of the electronic converter of FIG. 5.

FIG. 18 shows thus a modified embodiment that is capable of inhibiting or at least reducing this current flow towards the node 312. Specifically, in the embodiment considered, the electronic converter 30a comprises (in addition to the components described with respect to FIG. 15) at least one of:

a capacitor Cf1 connected (e.g., directly) between the terminal 306 and the terminal 300 providing the supply voltage $V_{bat}$; and a capacitor Cf2 connected (e.g., directly) between the terminal 304 and ground GND, i.e., the terminal 302.

In various embodiments, taking into account typical values for the parasitic current $I_{par1}$ and $I_{par2}$ the capacitors Cf1 and Cf2 may have a capacitance being significantly smaller than the capacitance of the capacitor Cf, such as less than 5%, preferably between 0.1% and 2%, preferably approximately 1%. For example, in various embodiments, the capacitance of the capacitors Cf1 and Cf2 is between 10 and 100 nF. In various embodiments, the capacitors Cf1 and Cf2 may have the same capacitance.

Accordingly, in the embodiment considered, the parasitic currents $I_{par1}$ and $I_{par2}$ will also flow. However, the current pulse $(I_{par1}-I_{par2})$ will not flow (or will flow less) towards the node 312 but through the low impedance path provided by the capacitor Cf1 and/or the capacitor Cf2 (and also the capacitor Cf).

Generally, the capacitors Cf1 and/or Cf2 may be connected to any reference voltage having a low impedance towards ground GND (as it is the case for the supply voltage $V_{bat}$). For example, the capacitors Cf1 may also be connected to the terminal 302 (instead of the terminal 300) and/or the capacitors Cf2 may also be connected to the terminal 300 (instead of the terminal 302).

FIG. 19 shows a second embodiment for obtaining the voltage offsets $V_{float+}$ and $V_{float-}$ with respect to ground GND. Specifically, the embodiment is based on the circuit shown in FIG. 11 and comprises in addition two further circuits:

a first clamp circuit 36 connected (e.g., directly) to the terminal 306; and a second clamp circuit 38 connected (e.g., directly) to the terminal 308.

Specifically, in the embodiment considered, the first clamp circuit 36 is configured to selectively permit a current flow towards the terminal 306 until the voltage corresponds to an upper voltage threshold $V_H$.

For example, as shown in FIG. 20, the clamp circuit 36 may comprise a transistor 362, such as a n-channel FET, such as an NMOS, connected (e.g., directly) between the terminal 300 providing the supply voltage $V_{bat}$ and the terminal 306.

In the embodiment considered, the gate terminal of the transistor 362 is driven by an operational amplifier 364. Specifically, in the embodiment considered, the operational amplifier 364 receives at the non-inverting/positive input terminal the upper voltage threshold $V_H$ and at the inverting/negative input terminal the voltage at the terminal 306.

Accordingly, the circuit 36 will drive the transistor 362 thereby permitting a current flow (from the supply voltage $V_{bat}$) towards the terminal 306, until the voltage at the terminal 306 reaches or is greater than the voltage $V_H$.

Conversely, in the embodiment considered, the second clamp circuit 38 is configured to selectively permit a current flow from the terminal 304 until the voltage corresponds to a lower voltage threshold $V_L$.

For example, as shown in FIG. 21, the clamp circuit 38 may comprise a transistor 382, such as a p-channel FET, such as a PMOS, connected (e.g., directly) between the terminal 304 and the terminal 302 (ground GND).

In the embodiment considered, the gate terminal of the transistor 382 is driven by an operational amplifier 384. Specifically, in the embodiment considered, the operational amplifier receives at the non-inverting/positive input terminal the lower voltage threshold $V_L$ and at the inverting/negative input terminal the voltage at the terminal 304.

Accordingly, the circuit 38 will drive the transistor 382 thereby permitting a current flow from the terminal 304 (towards ground GND), until the voltage at the terminal 304 reaches or is smaller than the voltage $V_L$.

In various embodiments, the clamp circuits 36 and 38 are not used to directly impose the voltages $V_{ref}+/-V_{float}/2$, but the clamp circuits set only approximately the voltages at the nodes 304 and 306 with respect to ground GND.

Specifically, in various embodiments, the upper and the lower threshold correspond to:

$$V_H = V_{ref} + V_{float}/2 - \Delta$$

$$V_L = V_{ref} - V_{float}/2 + \Delta$$

Accordingly, without any switching activity of the switches Sh, Sl, Sbb, the clamp circuits 36 and 38 would set the following voltages (via the coupling of the capacitor Cf):

$$V_{float+} = V_{ref} + V_{float}/2 - \Delta$$

$$V_{float-} = V_{ref} - V_{float}/2 + \Delta$$

and the voltage difference $V_{Diff}$ between the terminals 306 and 304 would be:

$$V_{Diff+}F = V_{float} - 2\Delta$$

For example, in various embodiments, the value of $\Delta$ is selected between 5% and 20% of the value of $V_{float}$, e.g., $\Delta = 0.1 V_{float}$. For example, $\Delta$ may be between 150 and 180 mV for $V_{float} = 1.8$ V.

Accordingly, once the control unit 32 drives the switches of the converter 30a, the control unit 32 will also regulate the voltage difference $V_{Diff}$ until the value corresponds to the requested value $V_{float}$.

When the supply voltage $V_{bat}$ remains constant, the clamp circuits 36 and 38 do not intervene during this regulation of the voltage difference $V_{Diff}$. Conversely, the clamp circuits 34 and 36 may absorb the current peaks generated by the parasitic current mentioned before and/or may intervene when the supply voltage $V_{bat}$ varies.

Figure 22:
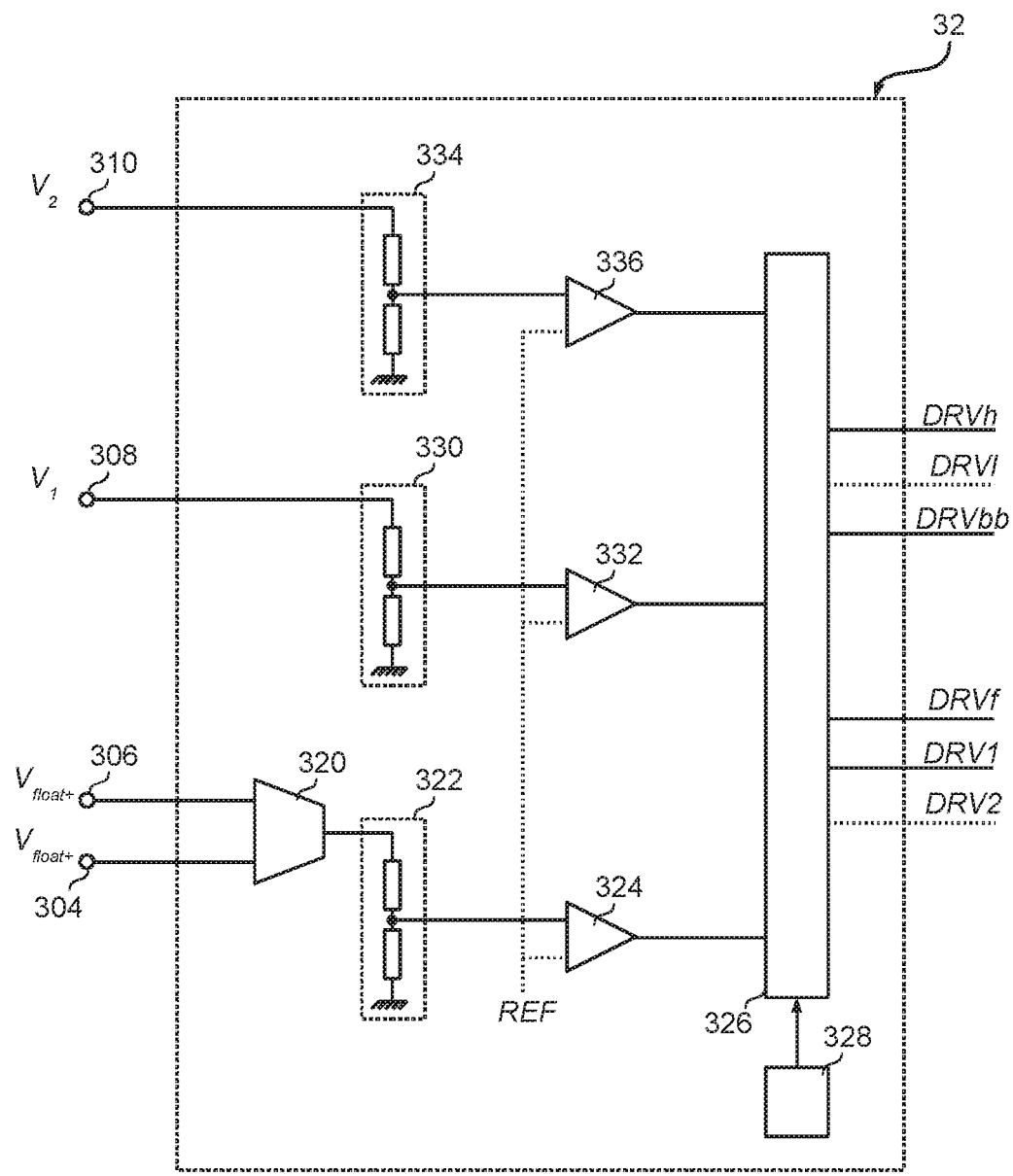
FIG. 22 shows an embodiment of a control circuit for the electronic converters of FIGS. 11, 15, 18 and 19.

FIG. 22 shows in this respect a possible embodiment of the control circuit 32. Specifically, in the embodiment considered, the voltages $V_{float+}$ and $V_{float-}$ are provided to a differential amplifier 320, e.g., based on an operation amplifier. The output of the differential amplifier 320 is connected to an error amplifier 324, such as a PI (Proportional-Integral) or PID (Proportional-Integral-Derivative) regulator, configured to generate an error signal as a function of the voltage difference and a reference signal REF. In the embodiment considered a scaling circuit and/or a current-voltage conversion circuit 322, such as a voltage divider comprising two resistors, may be connected between the differential amplifier 320 and the error amplifier 324.

In the embodiment considered, the optional voltages $V_1$ and $V_2$ may be provided similarly to respective error amplifiers 332 and 336. While also in this case may be used scaling circuits 330 and 334, usually no differential amplifiers are required, because the voltages $V_1$ and $V_2$ are referred to ground GND.

The error signals at the output of the error amplifiers 324, 332 and 336 are provided to a driver circuit 326. Specifically, in the embodiment considered, the driver circuit 326 is configured to manage the charge phase and the various discharge phases by generating the drive signals for the switches Sh, Sl, Sbb, S+, S− S1 and S2. Generally, the drive signal DRVl for the switch Sl and the drive signal DRV2 for the switch S2 are purely optional, because these switches may also be implemented with diodes.

For example, in various embodiments, the driver circuit 326 may be a Pulse-Width-Modulation (PWM) driver circuit. For this reason, the driver circuit 326 may have associated an oscillator 328 configured to generate an oscillator signal having a fixed frequency, i.e., a fixed switching period $T_{SW}$.

For example, once the oscillator signal indicates the start of a new switching cycle (corresponding essential to the instant $t_0$ of FIG. 13), the driver circuit 326 sets the drive signals DRVh and DRVbb for closing the switches Sh and Sbb. At the instant $t_1$, i.e., after the duration $T_{charge}$, the driver circuit 326 sets the drive signals DRVh and DRVbb for opening the switches Sh and Sbb. Accordingly, in the embodiment considered, these drive signals DRVh and DRVbb are PWM signals, which are set:

to a first logic level (e.g., high) for a switch-on duration corresponding to the duration $T_{charge}$; and to a second logic level (e.g., low) for a switch-off duration corresponding to $T_{SW}-T_{charge}$.

In the embodiment considered, the driver circuit 326 sets then (e.g., at the instant $t_1$) the drive signal DRVf for closing the switches S+ and S−. At the instant $t_3$, i.e., after the duration $T_{+/-}$, the driver circuit 326 sets the drive signal DRVf for opening the switches S+ and S−. Accordingly, in the embodiment considered, the drive signal DRVf is a PWM signal, which is set:

to a first logic level (e.g., high) for a switch-on duration corresponding to the duration $T_{+/-}$; and to a second logic level (e.g., low) for a switch-off duration corresponding to $T_{SW}-T_{+/-}$.

In the embodiment considered, the driver circuit 326 sets then (e.g., at the instant $t_3$) the drive signal DRV1 for closing the switch S1 (and possibly the drive signal DRVl for closing the switch Sl). At the instant $t_4$, i.e., after the duration $T_1$, the driver circuit 326 sets the drive signal DRV1 for opening the switch S1. Accordingly, in the embodiment considered, the drive signal DRV1 is a PWM signal, which is set:

to a first logic level (e.g., high) for a switch-on duration corresponding to the duration $T_1$; and to a second logic level (e.g., low) for a switch-off duration corresponding to $T_{SW}-T_1$.

Generally, the driver circuit 326 may then generate the drive signal DRV2 for the switch S2. Conversely, in the embodiment considered the switch S2 is implemented with a diode. Accordingly, when the switches S+, S− and S1 are opened, the current $I_L$ will flow through the diode S2 towards the terminal 310 until the current $I_L$ reaches zero or the switching duration $T_{SW}$ has finished.

Specifically, in the embodiment considered, the driver circuit 326 is configured to vary the switch-on durations $T_{+/-}$ and $T_1$ of the drive signals DRVf and DRV1 as a function of the error signals provided by the error amplifiers 324 and 332, respectively. Specifically, in the embodiment considered, the error amplifiers 324 and 332 will vary these durations (via the respective error signals) until the voltages $V_{float}$ and $V_1$ correspond to the respective requested values.

Conversely, in the embodiment considered, the driver circuit 326 is configured to vary the switch-on duration $T_{charge}$ of the drive signals DRVh and DRVbb as a function of the error signal provided by the error amplifiers 336. Specifically, in the embodiment considered, the error amplifier 336 will vary the duration (via the respective error signal), thereby varying the maximum current $I_L$, until the voltages $V_2$ correspond to the respective requested values. Additionally, the driver circuit 326 may vary the switch-on duration $T_{charge}$ also as a function of the error signals provided by the other error amplifiers, e.g., the amplifiers 324 and 332, which may be useful in order to perform a (predictive) control in case of short load variations of the outputs. For example, such an arrangement is useful when the error amplifiers 324, 332 and 336 have (in addition to an integral component) a proportional and/or derivative component.

Accordingly, in various embodiments, the control unit 32 is configured to manage the following phases which are repeated periodically:

a charge phase $T_{charge}$, wherein the control circuit 32 closes the switches Sh and Sbb for storing energy in the inductor L;

a (last) discharge phase, wherein the energy stored in the inductor L is transferred to an output; and one or more optional intermediate discharge phases between the charge phase and the last discharge phase, wherein the energy stored in the inductor L is transferred to one or more respective other outputs.

Generally, the discharge phase $T_{+/-}$ may be the last discharge phase or an intermediate discharge phase.

Specifically, in various embodiments, the control unit is configured to stop an intermediate phase when the respective output voltage reaches the requested value. Conversely, the last discharge phase is used to control the duration of the charge phase $T_{charge}$.

For example, by using a PWM modulation with constant switching cycle $T_{SW}$, the control unit 32 may:

increase the duration of the charge phase $T_{charge}$ (while maintaining the total duration $T_{SW}$) when, at the end of the last discharge phase, the respective output voltage is smaller than the requested value; and decrease the duration of the charge phase $T_{charge}$ (while maintaining the total duration $T_{SW}$) when, at the end of the last discharge phase, the respective output voltage is greater than the requested value.

Generally, the duration of the last discharge phase may also be constant. Thus, the control unit 32 may:

increase the duration of the charge phase $T_{charge}$ when, at the end of the last discharge phase, the respective output voltage is smaller than the requested value; and decrease the duration of the charge phase $T_{charge}$ when, at the end of the last discharge phase, the respective output voltage is greater than the requested value.

Figure 23:
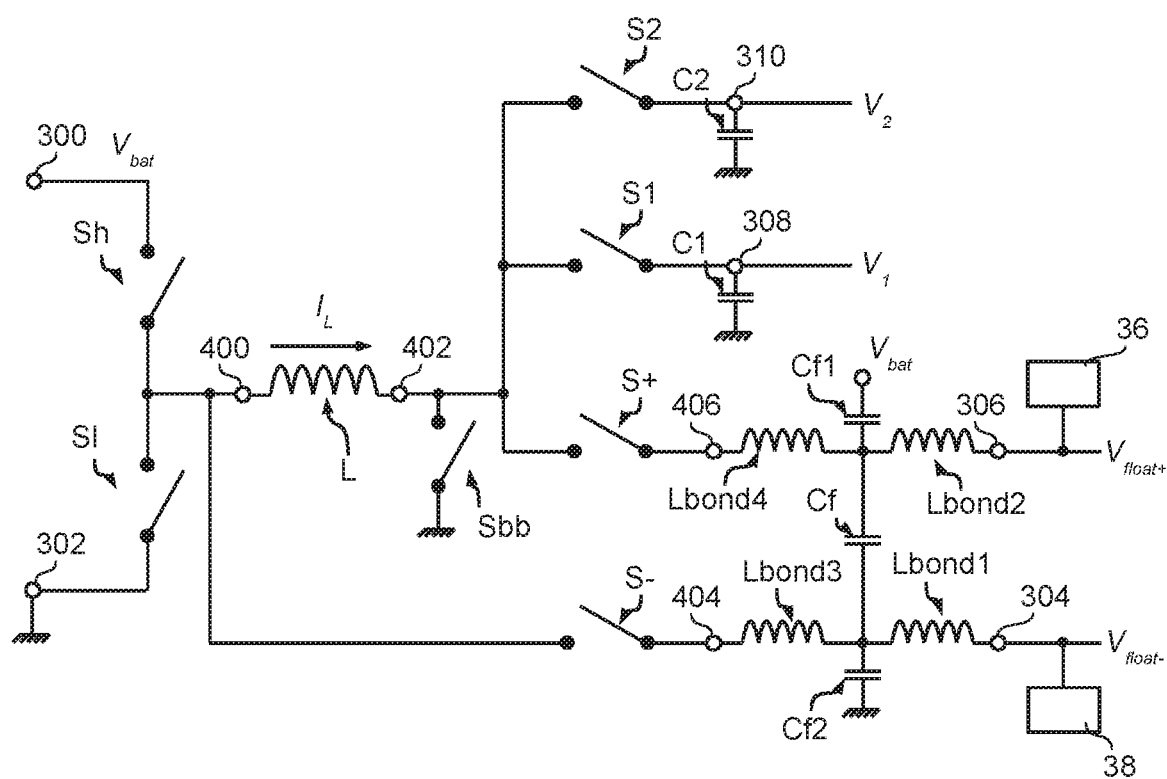
FIG. 23 shows a sixth embodiment of the electronic converter of FIG. 5.

Most of the components of the electronic converters 30a described in the foregoing may also be integrated in an integrated circuit. Generally, the term integrated circuit does not imply that the die is mounted within a package, but e.g., the die could also be mounted directly on a printed-circuit-board (PCB). Thus, the term pad is used to identify the pad of the die of the integrated circuit and the term pin identifies the pin or lead of an optional external package of the integrated circuit. Thus, when using the term "pad/pin" this indicates that the die has a pad and in case an external package is used, also the package has a corresponding pin, which is connected to the respective For example, FIG. 23 shows an embodiment, where such integrated circuit may comprise:

two pins/pads 300 and 302 for connection to the supply voltage $V_{bat}$;

the switches Sh, Sbb, S+ and S−;

the switch/diode Sl;

the optional switch S1;

the optional switch/diode S2;

the control circuit 32; and the optional clamp circuits 36 and 38.

In various embodiments, the integrated circuit does not comprise large inductors, capacitors and resistors, such as the inductor L, the capacitor Cf, and the capacitors C1 and C2, i.e., these components are external with respect to the integrated circuit. Conversely, small capacitors, such as the capacitors Cf1 and Cf2, and the various resistors described may be external or internal.

For example, in the embodiment considered, the integrated circuit comprises:

two pins/pads 400 and 402 for connection to an external inductor L;

a pin/pad 308 for connection to an external capacitor C1 (being optional insofar as the voltage $V_1$ is optional);

a pin/pad 310 for connection to an external capacitor C2 (being optional insofar as the voltage $V_2$ is optional); and at least two pins/pads for connection to the capacitor Cf.

Generally, the capacitor Cf may be connected directly to two pads/pins 304 and 306. Conversely, FIG. 23 shows an embodiment where four pins/pads 304, 306, 404 and 406 are used. Specifically, the pins/pads 404 and 406 are connected directly to the switches S− and S+, respectively. Conversely, the pins/pads 304 and 306 provide the voltages $V_{float−}$ and $V_{float+}$. Accordingly, in the embodiment considered, a first terminal of an external capacitor Cf may be connected to the pins/pads 304 and 404, thereby connecting the pin/pad 304 externally to the pin/pad 404, and a second terminal of the external capacitor Cf may be connected to the pins/pads 306 and 406, thereby connecting the pin/pad 306 externally to the pin/pad 406.

Specifically, this embodiment has the advantage that the parasitic inductances Lbond1, Lbond2, Lbond3 and Lbond4 of the bonding of the pins 304, 306, 404 and 404 implement with the capacitor Cf an improved filter stage for current peaks.

Generally, the various embodiments may also be combined. For example, in FIG. 23, the integrated circuit comprises also the clamp circuits 38 and 36 which are connected internally to the pins/pads 306 and 304.

Moreover, in the embodiment considered, the electronic converter comprises the capacitors Cf1 and Cf2, which are connected externally to the pins/pads 304/404 and 306/406, respectively.

Similarly, the electronic converter could also comprise the coupling resistors Rcm1 and Rcm2, which may be connected externally in parallel to the capacitor Cf or internally between the pins/pads 304/306 or 404/406.

Accordingly, the various embodiments described with respect to FIGS. 11 to 23 have the following advantages:

only a single phase $T_{−/−}$ is requested in order to regulate the output voltage $V_{float}$; accordingly, only a single control loop may be required, because only a single drive signal DRVf may be used;

a single output capacitor Cf is required for providing the output voltage $V_{float}$; accordingly, except for the parasitic currents and the optional filter capacitors Cf1 and CF2, the current used to charge the output capacitor does not flow towards ground GND;

the offset voltages $V_{float+}$ and $V_{float−}$ may be regulated faster, because the capacitances of the respective terminals towards the supply voltage $V_{bat}$ and ground GND are small.

Moreover, as described in the foregoing, the same electronic converter 30a may be used to generate in addition to the voltage $V_{float}$ also one or more additional voltages $V_1$ and $V_2$. In case these voltages are absent, the respective switches S1 and S2, and also the switch/diode S1 may be omitted.

Of course, without prejudice to the principle of the invention, the details of construction and the embodiments may vary widely with respect to what has been described and illustrated herein purely by way of example, without thereby departing from the scope of the present invention, as defined by the ensuing claims.

What is claimed is:

1. An electronic converter comprising:

a first input terminal and a second input terminal configured to receive a supply voltage across the first and second input terminals, wherein the second input terminal is configured to receive a ground voltage;

a first output terminal and a second output terminal configured to provide a regulated voltage across the first and second output terminals, wherein a first floating voltage at the first output terminal is configured to vary with respect to the ground voltage while the first and second output terminals provide the regulated voltage across the first and second output terminals, the first and second output terminals configured to be coupled to a capacitor;

a first inductor terminal and a second inductor terminal, the first and second inductor terminals configured to be coupled to an inductor;

a first switch coupled between the first input terminal and the first inductor terminal;

a second switch coupled between the second inductor terminal and the second input terminal;

a third switch coupled between the second inductor terminal and the first output terminal;

a fourth switch coupled between the first inductor terminal and the second output terminal; and
a control circuit configured to:
monitor the regulated voltage,
during a charge phase, increase an inductor current flowing through the inductor by closing the first and second switches,
during a discharge phase, increase the regulated voltage and charge the capacitor with the inductor current by closing the third and fourth switches, and
regulate a duration of the charge phase or the discharge phase such that the regulated voltage corresponds to a target value.

2. The electronic converter of claim 1, wherein the control circuit is configured to:
at an end of the discharge phase, compare the regulation voltage with the target value;
increase a duration of the charge phase when the regulation voltage is smaller than the target value; and
decrease the duration of the charge phase when the regulation voltage is greater than the target value.

3. An electronic converter comprising:
a first input terminal and a second input terminal configured to receive a supply voltage across the first and second input terminals;
a first output terminal and a second output terminal configured to provide a regulated voltage across the first and second output terminals, the first and second output terminals configured to be coupled to a capacitor;
a first inductor terminal and a second inductor terminal, the first and second inductor terminals configured to be coupled to an inductor;
a first switch coupled between the first input terminal and the first inductor terminal;
a second switch coupled between the second inductor terminal and the second input terminal;
a third switch coupled between the second inductor terminal and the first output terminal;
a fourth switch coupled between the first inductor terminal and the second output terminal;
a fifth switch coupled between the first inductor terminal and the second input terminal;
a third output terminal configured to provide a second regulated voltage with respect to the second input terminal;
a second capacitor coupled between the second output terminal and the second input terminal;
a sixth switch coupled between the second inductor terminal and the third output terminal; and
a control circuit configured to:
monitor the regulated voltage,
during a charge phase, increase an inductor current flowing through the inductor by closing the first and second switches,
during a discharge phase, increase the regulated voltage and charge the capacitor with the inductor current by closing the third and fourth switches,
regulate a duration of the charge phase or the discharge phase such that the regulated voltage corresponds to a target value,
monitor the second regulated voltage,
during a second discharge phase, increase the second regulated voltage and charge the second capacitor with the inductor current by closing the fifth and sixth switches, and
regulate the duration of the charge phase or the second discharge phase such that the second regulated voltage corresponds to a second target value.

4. The electronic converter of claim 3, wherein the fifth switch or the sixth switch is a diode.

5. The electronic converter of claim 3, wherein the control circuit is further configured to repeat periodically the charge phase, the discharge phase, and the second discharge phase, wherein one of the discharge phase and the second discharge phase corresponds to a last discharge phase and the other of the discharge phase and the second discharge phase corresponds to an intermediate discharge phase between the charge phase and the last discharge phase.

6. The electronic converter of claim 5, wherein the control circuit is further configured to stop the intermediate discharge phase when a respective voltage being increased during the intermediate discharge phase reaches a respective target value, wherein the respective voltage corresponds to the regulated voltage when the intermediate discharge phase corresponds to the discharge phase and to the second regulated voltage when the intermediate discharge phase corresponds to the second discharge phase, and wherein the respective target value corresponds to the target value when the intermediate discharge phase corresponds to the discharge phase and to the second target value when the intermediate discharge phase corresponds to the second discharge phase.

7. The electronic converter of claim 5, wherein the control circuit is further configured to:
increase the duration of the charge phase when, at an end of the last discharge phase, a respective voltage being increased during the last discharge phase is smaller than a respective target value; and
decrease the duration of the charge phase when, at the end of the last discharge phase, the respective voltage is greater than the respective target value, wherein the respective voltage corresponds to the regulated voltage when the last discharge phase corresponds to the discharge phase, and to the second regulated voltage when the last discharge phase corresponds to the second discharge phase and wherein the respective target value corresponds to the target value when the last discharge phase corresponds to the discharge phase and to the second target value when the last discharge phase corresponds to the second discharge phase.

8. The electronic converter of claim 1, further comprising:
a reference voltage generator coupled between the first input terminal and the second input terminal, the reference voltage generator configured to generate a reference voltage at a reference voltage node;
a first resistor coupled between the first output terminal and the reference voltage node; and
a second resistor coupled between the second output terminal and the reference voltage node.

9. The electronic converter of claim 8, wherein the reference voltage generator comprises a voltage divider coupled between the first input terminal and the second input terminal, and wherein the voltage divider comprises the reference voltage node.

10. The electronic converter of claim 8, wherein the reference voltage is proportional to the supply voltage.

11. The electronic converter of claim 1, further comprising:
a first capacitor coupled between the first output terminal and the first input terminal or the second input terminal; or a second capacitor coupled between the second output terminal and the first input terminal or the second input terminal.

12. An electronic converter comprising:
a first input terminal and a second input terminal configured to receive a supply voltage across the first and second input terminals;
a first output terminal and a second output terminal configured to provide a regulated voltage across the first and second output terminals, the first and second output terminals configured to be coupled to a capacitor;
a first inductor terminal and a second inductor terminal, the first and second inductor terminals configured to be coupled to an inductor;
a first switch coupled between the first input terminal and the first inductor terminal;
a second switch coupled between the second inductor terminal and the second input terminal;
a third switch coupled between the second inductor terminal and the first output terminal;
a fourth switch coupled between the first inductor terminal and the second output terminal;
a first clamp circuit configured to selectively permit a current flow towards the first output terminal until a voltage between the first output terminal and the second input terminal is greater than or equal to an upper voltage;
a second clamp circuit configured to selectively permit a current flow from the second output terminal until a voltage between the second output terminal and the second input terminal is less than or equal to a lower voltage, wherein the upper voltage is higher than the lower voltage; and
a control circuit configured to:
monitor the regulated voltage,
during a charge phase, increase an inductor current flowing through the inductor by closing the first and second switches,
during a discharge phase, increase the regulated voltage and charge the capacitor with the inductor current by closing the third and fourth switches, and
regulate a duration of the charge phase or the discharge phase such that the regulated voltage corresponds to a target value.

13. The electronic converter of claim 1, further comprising:
the inductor coupled between the first inductor terminal and the second inductor terminal; and
the capacitor coupled between the first output terminal and the second output terminal.

14. The electronic converter of claim 1, wherein the electronic converter is configured to provide the regulated voltage to an audio system.

15. An integrated circuit comprising:
a first input pin or pad and a second input pin or pad, the first and second input pins or pads configured to receive a supply voltage across the first and second input pins or pads wherein the second input pin or pad is configured to receive a ground voltage;
a first output pin or pad and a second output pin or pad, the first and second output pins or pads configured to provide a regulated voltage across the first and second output pins or pads, wherein a first floating voltage at the first output pin or pad is configured to vary with respect to the ground voltage while the first and second output pins or pads provide the regulated voltage across the first and second output pins or pads, the first and second output pins or pads being configured to be connected to a capacitor;
a first inductor pin or pad and a second inductor pin or pad configured to be coupled to an inductor;
a first electronic switch coupled between the first input pin or pad and the first inductor pin or pad;
a second electronic switch coupled between the second inductor pin or pad and the second input pin or pad;
a third electronic switch coupled between the second inductor pin or pad and the first output pin or pad;
a fourth electronic switch coupled between the first inductor pin or pad and the second output pin or pad; and
a control circuit configured to:
monitor the regulated voltage,
during a charge phase, increase an inductor current flowing through the inductor by closing the first and second electronic switches,
during a discharge phase, increase the regulated voltage and charge the capacitor with the inductor current by closing the third and fourth electronic switches, and
regulate a duration of the charge phase or the discharge phase such that the regulated voltage corresponds to a target value.

16. The integrated circuit of claim 15, the capacitor coupled between the first output pin or pad and the second output pin or pad.

17. A method of operating an electronic converter, the method comprising:
monitoring a regulated voltage between a first output terminal and a second output terminal of the electronic converter;
during a charge phase, increasing an inductor current flowing through an inductor by closing a first switch and a second switch of the electronic converter, wherein the first switch is coupled between a first terminal of a power supply and a first terminal of the inductor and the second switch is coupled between a second terminal of the inductor and a second terminal of the power supply;
during a discharge phase, increasing the regulated voltage and charging a capacitor operatively coupled between the first and second output terminals with the inductor current by closing a third switch and a fourth switch of the electronic converter, wherein the third switch is coupled between the second terminal of the inductor and the first output terminal and the fourth switch is coupled between the second terminal of the inductor and the second output terminal; and
regulating a duration of the charge phase or the discharge phase such that the regulated voltage corresponds to a target value.

18. The method of claim 17, further comprising:
comparing the regulated voltage with the target value at an end of the discharge phase;
increasing a duration of the charge phase when the regulated voltage is smaller than the target value; and
decreasing the duration of the charge phase when the regulated voltage is greater than the target value.

19. A method of operating an electronic converter, the method comprising:
monitoring a regulated voltage between a first output terminal and a second output terminal of the electronic converter;
during a charge phase, increasing an inductor current flowing through an inductor by closing a first switch and a second switch of the electronic converter, wherein the first switch is coupled between a first terminal of a power supply and a first terminal of the inductor and the second switch is coupled between a second terminal of the inductor and a second terminal of the power supply;

during a discharge phase, increasing the regulated voltage and charging a capacitor coupled between the first and second output terminals with the inductor current by closing a third switch and a fourth switch of the electronic converter, wherein the third switch is coupled between the second terminal of the inductor and the first output terminal and the fourth switch is coupled between the second terminal of the inductor and the second output terminal;

regulating a duration of the charge phase or the discharge phase such that the regulated voltage corresponds to a target value;

monitoring a second regulated voltage between a third output terminal of the electronic converter and the second terminal of the power supply;

during a second discharge phase, increasing the second regulated voltage and charging a second capacitor with the inductor current by closing a fifth switch and a sixth switch, wherein the second capacitor is coupled between the second output terminal and the second terminal of the power supply, the fifth switch is coupled between the first terminal of the inductor and the second terminal of the power supply, and the sixth switch is coupled between the second terminal of the inductor and the third output terminal; and regulating a duration of the charge phase or the second discharge phase such that the second regulated voltage corresponds to a second target value.

20. The method of claim 19, further comprising repeating periodically the charge phase, the discharge phase, and the second discharge phase, wherein one of the discharge phase and the second discharge phase corresponds to a last discharge phase and the other of the discharge phase and the second discharge phase corresponds to an intermediate discharge phase between the charge phase and the last discharge phase.

21. The method of claim 20, further comprising stopping the intermediate discharge phase when a respective voltage of the regulated voltage or the second regulated voltage being increased during the intermediate discharge phase reaches a respective target value of the target value or the second target value.

22. The method of claim 17, wherein the power supply is a battery of a car.

23. The electronic converter of claim 1, wherein the capacitor is directly connected between the first output terminal and the second output terminal.

24. The method of claim 17, further comprising:
receiving a first supply voltage at the first terminal of the power supply;
receiving a ground voltage at the second terminal of the power supply;
providing a first floating voltage at the first output terminal so that the first floating voltage varies with respect to the ground voltage while the regulated voltage between the first and second output terminals correspond to the targeted value.

25. The method of claim 24, further comprising:
providing a reference voltage that is proportional to the first supply voltage;
generating the first floating voltage based on the reference voltage; and
varying the first supply voltage with respect to the ground voltage so that the first floating voltage varies with respect to the ground voltage.

* * * * *